(12) United States Patent
Nagasawa et al.

(10) Patent No.: US 8,116,050 B2
(45) Date of Patent: Feb. 14, 2012

(54) SEMICONDUCTOR INTEGRATED CIRCUIT

(75) Inventors: Toshinobu Nagasawa, Osaka (JP);
Tetsushi Toyooka, Kyoto (JP);
Masaharu Sato, Shiga (JP)

(73) Assignee: Panasonic Corporation, Osaka (JP)

( * ) Notice: Subject to any disclaimer, the term of this patent is extended or adjusted under 35 U.S.C. 154(b) by 408 days.

(21) Appl. No.: 12/539,251

(22) Filed: Aug. 11, 2009

(65) Prior Publication Data

US 2010/0039163 A1    Feb. 18, 2010

(30) Foreign Application Priority Data

Aug. 12, 2008 (JP) ................................. 2008-208064

(51) Int. Cl.
*H02H 9/00* (2006.01)
(52) U.S. Cl. .......... 361/57; 361/59; 361/93.1; 361/93.4; 361/98; 257/372; 257/E27.063
(58) Field of Classification Search .................... 361/57, 361/59, 93.1, 93.4, 98; 257/372, E27.063
See application file for complete search history.

(56) References Cited

U.S. PATENT DOCUMENTS

| | | | | |
|---|---|---|---|---|
| 5,140,177 A | * | 8/1992 | Suda et al. ........................ | 326/21 |
| 5,212,616 A | * | 5/1993 | Dhong et al. .................... | 361/18 |
| 5,543,650 A | * | 8/1996 | Au et al. ........................ | 257/355 |
| 6,359,316 B1 | * | 3/2002 | Voss et al. ..................... | 257/369 |
| 7,145,191 B1 | * | 12/2006 | Teng et al. .................... | 257/288 |
| 7,221,027 B2 | * | 5/2007 | Lin ................................ | 257/355 |
| 7,348,793 B2 | * | 3/2008 | Cecchi ..................... | 324/762.09 |
| 7,692,906 B2 | * | 4/2010 | Tailliet ........................... | 361/56 |
| 2008/0036011 A1 | | 2/2008 | Okushima | |

FOREIGN PATENT DOCUMENTS

JP          9-116022          5/1997

* cited by examiner

*Primary Examiner* — Patrick Salce
(74) *Attorney, Agent, or Firm* — Hamre, Schumann, Mueller & Larson, P.C.

(57) ABSTRACT

To provide a semiconductor integrated circuit including: a detection circuit that detects an occurrence of latch up and can be configured while adopting a layout configuration that suppresses the occurrence of latch up; and a recovery unit that enables a recovery from the latch up without cutting off a positive potential. The semiconductor integrated circuit includes: a n-channel MOS transistor 7 that is formed on a P-type region 3 on a semiconductor substrate; and a latch up detection circuit that detects an occurrence of latch up in the n-channel MOS transistor 7. The latch up detection circuit includes: a n-MOS transistor structure 12 in which a source 10 and a back gate 8 are connected in common with a source 5 and the back gate 8 of the n-channel MOS transistor 7; and an electric current detection unit 15 that detects an electric current flowing to a drain 9 of the n-MOS transistor structure 12.

16 Claims, 14 Drawing Sheets

SEMICONDUCTOR INTEGRATED CIRCUIT

BACKGROUND OF THE INVENTION

1. Field of the Invention

The present invention relates to a semiconductor integrated circuit, particularly to a semiconductor integrated circuit having a function of detecting the occurrence of latch up, and further to a semiconductor integrated circuit having a function of making a recovery from latch up at the occurrence thereof.

2. Description of Related Art

In recent years, as circuit system applications are diversified, there have been more cases of using a configuration in which a circuit block that operates between a positive potential and a ground potential (GND) and a circuit block that operates between a positive potential and a negative potential are formed on a common semiconductor substrate. For this configuration, generally, a semiconductor integrated circuit with a so-called triple well structure is used in which a N-type diffusion (N-well) layer is formed in a P-type substrate (P-sub) layer, and a P-type diffusion (P-well) layer is formed further in the N-type diffusion layer.

Furthermore, in a CMOS integrated circuit, with respect to a P-type diffusion layer and a N-type diffusion layer on a common semiconductor substrate, a n-channel MOS transistor (NMOS) is formed on the P-type diffusion layer, and a p-channel MOS transistor (PMOS) is formed on the N-type diffusion layer.

In the circuit block that operates between a positive potential and a negative potential in the above-described semiconductor integrated circuit with the triple well structure, a ground potential is applied to the P-type substrate layer, a positive potential that usually is a power supply voltage potential is applied to the N-type diffusion layer, and a negative potential that usually is a lowest potential is applied to the P-type diffusion layer. Further, depending on a circuit configuration, in some cases, a negative potential is connected to a source of a n-channel MOS transistor that is formed on the P-type diffusion layer, and a drain thereof is connected to an input terminal or an output terminal of the semiconductor integrated circuit and thus is connected to the exterior of the semiconductor integrated circuit. In such a case, applying the positive potential to the N-type diffusion layer allows the N-type diffusion layer to play a role as a channel stopper, and thus even in the case where a potential of each terminal of the n-channel MOS transistor becomes lower than that of the P-type substrate layer, a parasitic diode is prevented from being turned on, thereby allowing a normal circuit operation to be performed. However, when a potential lower than a back-gate voltage that is a potential supplied to the P-type diffusion layer is applied to the drain of the n-channel MOS transistor, latch up, which refers to a state where an abnormal current flows continuously from the P-type substrate layer connected to the ground potential to the negative potential, might occur.

The following describes a principle by which such latch up occurs with reference to FIGS. 14 and 15.

FIG. 14 is a cross-sectional structural view of a semiconductor integrated circuit with a typical triple well structure including a n-channel MOS transistor. As shown in FIG. 14, in the semiconductor integrated circuit with the triple well structure, a N-type diffusion layer 102 is formed in a P-type substrate layer 101, and a P-type diffusion layer 103 is formed in the N-type diffusion layer 102.

A N-type impurity is implanted into the P-type diffusion layer 103 so that a drain 104 and a source 105 are formed, and a gate 106 is formed on a portion of a substrate between the drain 104 and the source 105 via an unshown insulating film, thereby constituting a n-channel MOS transistor 107. Further, a back gate 108 that is a P-type contact region is formed in the vicinity of the source 105.

Herein, the source 105 of the n-channel MOS transistor and the back gate 108 are connected to a negative potential VSS. Further, the P-type substrate layer 101 is connected to a ground potential via a high-concentration impurity region 110, and the N-type diffusion layer 102 is connected to a power supply voltage potential VDD via a high-concentration impurity region 109. Moreover, the drain 104 of the n-channel MOS transistor 107 is connected to a terminal A that is linked to the exterior of the semiconductor integrated circuit.

In this case, in the semiconductor integrated circuit shown in FIG. 14, a double emitter parasitic npn transistor 111 that uses the drain 104 and the source 105 of the n-channel MOS transistor as a double emitter, the power supply voltage potential VDD to be applied to the N-type diffusion layer 102 as a collector, and the P-type diffusion layer 103 as a base, and a parasitic pnp transistor 112 that uses the P-type substrate layer 101 as an emitter, the P-type diffusion layer 103 as a collector, and the N-type diffusion layer 102 as a base, are formed. Further, a parasitic resistance 113 is formed between the P-type substrate layer 101 and the ground potential (GND), a parasitic resistance 114 is formed between the N-type diffusion layer 102 and the power supply voltage potential VDD to be applied thereto, and a parasitic resistance 115 is formed between the P-type diffusion layer 103 and the back gate 108.

FIG. 15 shows a thyristor structure formed by the parasitic elements of the semiconductor integrated circuit including the n-channel MOS transistor shown in FIG. 14. In FIG. 15, when a voltage lower than VSS is applied to the terminal A of the double emitter parasitic npn transistor 111, a base-emitter (terminal A) voltage increases, so that the parasitic npn transistor 111 is turned on. It is conceived that a base current that flows at this time when the parasitic npn transistor 111 begins to be turned on is supplied from the negative potential VSS.

A collector current of the parasitic npn transistor 111 makes an electric current flow from VDD via the parasitic resistance 114 in the N-type diffusion layer 102 and leads a base current of the parasitic pnp transistor 112 thereinto. When the voltage applied to the terminal A decreases further, the collector current of the parasitic npn transistor 111 increases, and a base potential of the parasitic pnp transistor 112 decreases, so that the parasitic pnp transistor 112 is turned on. An emitter current of the parasitic pnp transistor 112 flows from the ground potential (GND) via the parasitic resistance 113 in the P-type substrate layer 101. Further, a collector current of the parasitic pnp transistor 112 flows to the parasitic resistance 115 in the P-type diffusion layer and to the base of the parasitic npn transistor 111.

In the end, a latch up state is reached in which a base potential of the parasitic npn transistor 111 increases, and even with no voltage applied to the terminal A, an electric current continues to flow to the emitter of the parasitic npn transistor 111, which is connected to the negative potential VSS. Among conditions for which latch up persists at this time is a voltage level of the negative potential. Generally, latch up is liable to persist when VSS has a value not higher than −1 V, though this value may vary depending on the type of a semiconductor process.

As a measure to prevent the occurrence of such latch up, on a semiconductor substrate, layout structural consideration has been given to set the parasitic resistance 114 in the N-type diffusion layer 102 and the parasitic resistance 115 in the P-type diffusion layer 103 to have a low resistance value. However, the above-described measure based on the layout on the semiconductor substrate has an effect that may vary depending on a characteristic of a semiconductor process that is used, and in some cases, it is impossible to sufficiently prevent the occurrence of latch up.

With this as a background, a technique has been proposed that provides a unit that detects the occurrence of latch up and achieves a recovery from the latch up (see Patent Document 1). With reference to FIGS. 16 and 17, the following describes a configuration of a detection unit that detects the occurrence of latch up, which is described in Patent Document 1.

FIG. 16 is a cross-sectional structural view of a CMOS integrated circuit showing a configuration of a unit that detects the occurrence of latch up in Patent Document 1. In the CMOS integrated circuit shown in FIG. 16, a N-type diffusion layer 122 is provided in a P-type substrate layer 121.

A P-type impurity is implanted into the N-type diffusion layer 122 so that a source 123 and a drain 124 are formed, and together with a gate 125 between them, the source 123 and the drain 124 constitute a p-channel MOS transistor 126. Meanwhile, a N-type impurity is implanted into the P-type substrate layer 121 so that a source 127 and a drain 128 are formed, and together with a gate 129 between them, the source 127 and the drain 128 constitute a n-channel MOS transistor 130.

Furthermore, as shown in FIG. 16, the N-type diffusion layer 122 is connected to a power supply voltage potential VDD via a high-concentration impurity region 131, and VDD is connected to the source of the n-channel MOS transistor 126. Further, the P-type substrate layer 121 is connected to a ground potential (GND) via a high-concentration impurity region 133, and the source 127 of the n-channel MOS transistor 130 also is connected to the ground potential. The drain 124 of the p-channel MOS transistor 126 and the drain 128 of the n-channel MOS transistor 130 are connected to each other and then connected to an output terminal Vout of the CMOS integrated circuit.

In the above-described CMOS integrated circuit described in Patent Document 1 and shown in FIG. 16, a N-contact region 132 is formed in a portion of the N-type diffusion layer 122 between the p-channel MOS transistor 126 and the high-concentration impurity region 131, and a P-contact region 134 is formed in a portion of the P-type substrate layer 121 between the n-channel MOS transistor 130 and the high-concentration impurity region 133.

In this case, in the CMOS integrated circuit, a first parasitic pnp transistor 141 that uses the source 123 of the p-channel MOS transistor 126 as an emitter, the N-type diffusion layer 122 as a base, and the P-type substrate layer 121 as a collector, and a second parasitic pnp transistor 142 that uses the drain 124 of the p-channel MOS transistor 126 as an emitter, the N-type diffusion layer 122 as a base, and the P-type substrate layer 121 as a collector, are generated. Further, a first parasitic npn transistor 144 that uses the source 127 of the n-channel MOS transistor 130 as an emitter, the P-type substrate layer 121 as a base, and the N-type diffusion layer 122 as a collector, and a second parasitic npn transistor 143 that uses the drain 128 of the n-channel MOS transistor 130 as an emitter, the P-type substrate layer 121 as a base, and the N-type diffusion layer 122 as a collector, are generated.

Moreover, a resistance component 145 as a diffusion resistance is formed in a portion of the N-type diffusion layer 122 between the high-concentration impurity region 131 and the N-contact region 132, and a parasitic resistance 146 is formed between the N-contact region 132 and the N-type diffusion layer 122. Further, a resistance component 147 as a diffusion resistance is formed in a portion of the P-type substrate layer 121 between the high-concentration impurity region 133 and the P-contact region 134, and a parasitic resistance 148 is formed between the P-contact region 134 and the P-type substrate layer 121.

FIG. 17 shows a thyristor structure of the parasitic elements generated in the CMOS integrated circuit shown in FIG. 16.

In this case, when a potential of the output terminal Vout becomes higher than the power supply voltage potential VDD, a trigger current flows in from the emitter of the second parasitic pnp transistor 142 and flows through the parasitic resistance 148, thus causing a voltage drop. Due to this voltage drop, a base potential of the first parasitic npn transistor 144 increases, so that the first parasitic npn transistor 144 is turned on. When the first parasitic npn transistor 144 is turned on, a collector current of the first parasitic npn transistor 144 flows though the resistance component 145 and the parasitic resistance 146. At this time, a voltage drop is observed in a potential Vnw of a detection terminal of the N-type diffusion layer 122, which is connected to the N-contact region 132, and thus the occurrence of latch up can be detected based on this voltage drop. Similarly, a voltage drop is observed in a potential Vp-sub of a detection terminal of the P-type substrate layer 121, which is connected to the P-contact region 134, thereby allowing the occurrence of latch up to be detected.

In the CMOS integrated circuit described in Patent Document 1, when the occurrence of latch up is detected, the power supply voltage potential VDD is reduced to 0 V to be cut off so that a latch up state is allowed to cease, thereby achieving a recovery from the latch up.

Patent Document 1: JP 9(1997)-116022 A

SUMMARY OF THE INVENTION

In the above-described CMOS integrated circuit having the conventional configuration, latch up is detected using a potential drop in the resistance component 145 in the N-type diffusion layer 122 and in the resistance component 147 in the P-type substrate layer 121, which is caused by a latch up current generated when latch up occurs. In order to detect the occurrence of latch up more reliably in the above-described conventional CMOS integrated circuit, it is required that the resistance component 145 in the N-type diffusion layer 122 and the resistance component 147 in the P-type substrate layer 121 be set to have a large value. However, this runs counter to the layout structural consideration for preventing the occurrence of latch up, causing a problem in that for accurate detection of the occurrence of latch up, a structure likely to lead to the occurrence of latch up is adopted.

Furthermore, in the above-described conventional CMOS integrated circuit, as a measure to make a recovery from latch up, the power supply voltage potential VDD is cut off. However, it is conceived that cutting off VDD may exert an influence on all circuit blocks in the semiconductor integrated circuit. For example, in the case where a plurality of systems are control logics that are circuit blocks, each of which operates between the power supply voltage potential and the ground potential, and operational modes corresponding respectively to the control logics are set, there is a possibility that cutting off the power supply voltage potential VDD causes the operational modes that had been set before the occurrence of latch up to be changed after the recovery from the latch up, or exerts an influence on the respective operations of the systems of the circuit blocks.

The present invention is to solve the above-described problems with the conventional technique and has as its object to provide a semiconductor integrated circuit including: a detection circuit that detects the occurrence of latch up and can be configured while adopting a layout configuration that suppresses the occurrence of latch up; and a recovery unit that enables a recovery from the latch up without cutting off a positive potential.

In order to solve the above-described problems, a semiconductor integrated circuit of the present invention includes: a n-channel MOS transistor that is formed on a P-type region on a semiconductor substrate; and a latch up detection circuit that detects an occurrence of latch up in the n-channel MOS transistor. In the semiconductor integrated circuit, the latch up detection circuit includes: a n-MOS transistor structure in which a source and a back gate are connected in common with the n-channel MOS transistor; and an electric current detection unit that detects an electric current flowing to a drain of the n-MOS transistor structure.

Furthermore, a semiconductor integrated circuit of the present invention includes: a n-channel MOS transistor that is formed on a P-type region on a semiconductor substrate; a latch up detection circuit that detects an occurrence of latch up in the n-channel MOS transistor; a negative voltage generation circuit that supplies a negative potential to the n-channel MOS transistor; and a control block that halts the supply of a negative potential from the negative voltage generation circuit when the occurrence of latch up is detected in the latch up detection circuit, and later restarts the supply of a negative potential.

According to the semiconductor integrated circuit of the present invention, it is possible to detect the occurrence of latch up while adopting a layout configuration that suppresses the occurrence of latch up, and when the occurrence of latch up is detected, only a negative potential is cut off. This makes it possible to make a recovery from the latch up without exerting an adverse influence on any other circuit system.

The semiconductor integrated circuit of the present invention includes: a n-channel MOS transistor that is formed on a P-type region on a semiconductor substrate; and a latch up detection circuit that detects an occurrence of latch up in the n-channel MOS transistor. In the semiconductor integrated circuit, the latch up detection circuit includes: a n-MOS transistor structure in which a source and a back gate are connected in common with the n-channel MOS transistor; and an electric current detection unit that detects an electric current flowing to a drain of the n-MOS transistor structure.

According to this configuration, it is possible to detect the occurrence of latch up without causing any layout change to the n-channel MOS transistor with respect to which the detection of the occurrence of latch up is performed. Thus, it is possible to obtain a semiconductor integrated circuit that enables the detection of latch up while adopting a layout configuration that suppresses the occurrence of latch up.

In the above-described semiconductor integrated circuit according to the present invention, preferably, the electric current detection unit is a resistor that has one end connected to the drain of the n-MOS transistor structure and the other end connected to a positive power supply voltage of the semiconductor integrated circuit. Further, preferably, the electric current detection unit is an electric current detection circuit that is connected to the drain of the n-MOS transistor structure.

According to this configuration, it is possible to detect a drain current of the n-MOS transistor structure in the latch up detection circuit.

Furthermore, a configuration is possible in which the P-type region on the semiconductor substrate is a P-type substrate layer. Or alternatively, a configuration is possible in which the P-type region on the semiconductor substrate is a P-type diffusion layer that is formed in a N-type diffusion layer in a P-type substrate layer.

Moreover, preferably, a gate of the n-MOS transistor structure is connected to the source and the back gate of the n-MOS transistor structure.

Furthermore, preferably, a negative voltage is applied to the gate, the source, and the back gate of the n-MOS transistor structure that are connected to one another.

Moreover, a configuration is possible in which a drain of the n-channel MOS transistor is connected to an input terminal or an output terminal of the semiconductor integrated circuit.

Furthermore, the semiconductor integrated circuit of the present invention includes: a n-channel MOS transistor that is formed on a P-type region on a semiconductor substrate; a latch up detection circuit that detects an occurrence of latch up in the n-channel MOS transistor; a negative voltage generation circuit that supplies a negative potential to the n-channel MOS transistor; and a control block that halts the supply of a negative potential from the negative voltage generation circuit when the occurrence of latch up is detected in the latch up detection circuit, and later restarts the supply of a negative potential.

According to this configuration, it is possible to make a recovery from latch up by cutting off a negative potential supplied to the n-channel MOS transistor. This makes it possible to make a recovery from latch up without exerting an adverse influence on any other circuit block formed in the semiconductor integrated circuit.

Furthermore, preferably, the latch up detection circuit has a n-MOS transistor structure in which a source and a back gate are connected in common with the n-channel MOS transistor. According to this configuration, it is possible to detect latch up while adopting a layout structure that suppresses the occurrence of latch up, and it further is possible to make a recovery from latch up without exerting an adverse influence on any other circuit block that is not connected to a negative voltage of the semiconductor integrated circuit.

Furthermore, a configuration is possible in which a negative potential supplied by the negative voltage generation circuit is applied to a source and a back gate of the n-channel MOS transistor and to the source and the back gate of the n-MOS transistor structure.

Moreover, preferably, the control block restarts the supply of a negative potential after a lapse of a predetermined length of time after halting the supply of a negative potential from the negative voltage generation circuit. According to this configuration, the operation can be restarted while allowing more reliable recovery from latch up.

Furthermore, preferably, the control block restarts the supply of a negative potential from the negative voltage generation circuit when the latch up detection circuit detects a recovery from the latch up. According to this configuration, the operation can be restarted after a recovery from latch up has been confirmed.

Furthermore, preferably, the latch up detection circuit has at least two comparators that are: a first comparator that compares a potential related to a negative potential supplied from the negative voltage generation circuit with a first reference potential; and a second comparator that compares the potential related to a negative potential supplied from the negative voltage generation circuit with a second reference potential that is lower than the first reference potential, and based on outputs from the first comparator and the second comparator, the occurrence of latch up and the recovery from the latch up are detected. According to this configuration, based on a value of a negative potential, the occurrence of latch up and the recovery from latch up can be detected more reliably.

Herein, conceptually, a potential related to a negative potential supplied from the negative voltage generation circuit encompasses a negative potential itself, which is supplied from the negative voltage generation circuit, and further encompasses a potential that changes with variation of a negative potential supplied from the negative voltage generation circuit.

Moreover, preferably, the control block has a delay circuit so as to suspend the supply of a negative potential from the negative voltage generation circuit during a given time period after the latch up detection circuit has detected the recovery from the latch up. According to this configuration, after the detection of the occurrence of latch up, the operation can be restarted in a state where a recovery from the latch up has been achieved more reliably.

Furthermore, the following configuration is preferable. That is, the negative voltage generation circuit is capable of switching among halting of charging of the negative potential, charging of the negative potential at a low charging capability, and charging of the negative potential at a high charging capability. The latch up detection circuit has at least two comparators that are a first comparator that compares a potential related to a negative potential supplied from the negative voltage generation circuit with a first reference potential and a second comparator that compares the potential related to a negative potential supplied from the negative voltage generation circuit with a second reference potential that is lower than the first reference potential. The control block has a delay circuit that delays a signal in the control block and a timer circuit that fixes an output signal from the control block to the negative voltage generation circuit for a given length of time. When the control block detects that the negative potential is equal to the second reference potential based on outputs from the first comparator and the second comparator, the control block halts charging of the negative potential by the negative voltage generation circuit. Later, when the control block detects that the negative potential has become equal to the first reference potential based on outputs from the first comparator and the second comparator, the control block has the negative voltage generation circuit perform charging of the negative potential at a low charging capability during a period of time in which the timer circuit fixes the output signal after a delay time period delayed in the delay circuit, and after completion of the given length of time in which the timer circuit fixes the output signal, the control block has the negative voltage generation circuit perform charging of the negative potential at a high charging capability.

BRIEF DESCRIPTION OF THE DRAWINGS

FIG. 3 represents circuit block diagrams showing examples of a configuration of a latch up detection circuit of the semiconductor integrated circuit according to the first embodiment of the present invention, in which

DETAILED DESCRIPTION OF THE INVENTION

Hereinafter, the semiconductor integrated circuit according to the present invention will be described with reference to the appended drawings.

First Embodiment

Figure 1:
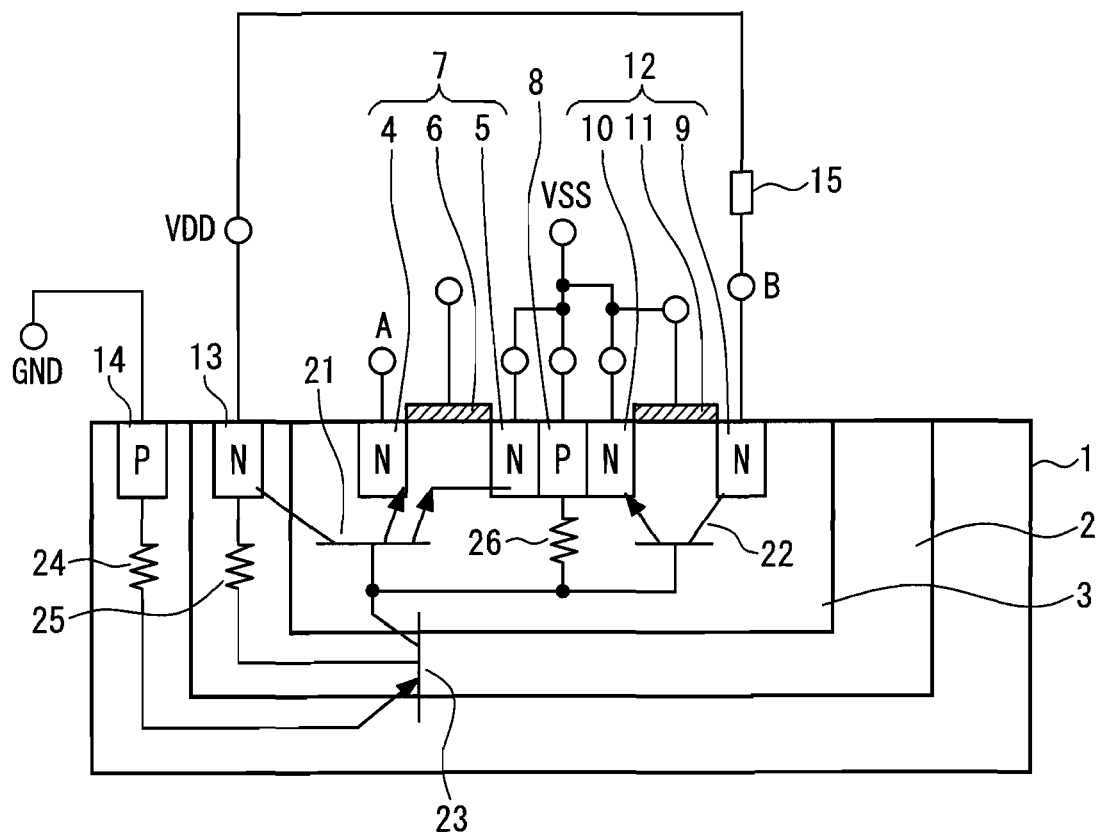
FIG. 1 is a partial enlarged cross-sectional structural view of a semiconductor integrated circuit according to a first embodiment of the present invention.

FIG. 1 is a partial enlarged cross-sectional view of a portion of a semiconductor integrated circuit according to the present embodiment, in which a n-channel MOS transistor and a latch up detection circuit that detects the occurrence of latch up in this n-channel MOS transistor are formed.

The semiconductor integrated circuit of the present embodiment has a so-called triple well structure in which a N-type diffusion (N-well) layer 2 is formed in a P-type substrate (P-sub) layer 1, and a P-type diffusion (P-well) layer 3 is formed in the N-type diffusion layer 2.

In the P-type diffusion layer 3 in the triple well structure, a drain 4 and a source 5 are formed by implantation of a N-type impurity, and a gate 6 is formed on a portion of a substrate between the drain 4 and source 5 via an unshown insulating film, thereby constituting a n-channel MOS transistor 7. Further, a back gate 8 that is a P-type contact region is formed in the vicinity of the source 5.

A n-MOS transistor structure 12 is formed in proximity to the n-channel MOS transistor 7 on the P-type diffusion layer 3. The n-MOS transistor structure 12 has the same configuration as that of the n-channel MOS transistor, i.e. has a drain 9 and a source 10 that are formed by implantation of a N-type impurity and a gate 11 that is formed on an unshown insulating film on a portion of the substrate between the drain 9 and the source 10. While having completely the same configuration as that of the n-channel MOS transistor as described above, the n-MOS transistor structure 12 does not function as a transistor that is a circuit element in the semiconductor integrated circuit and is intended only to detect the occurrence of latch up in the n-channel MOS transistor 7 that is in proximity thereto. That is why, in this specification, this structure is referred to as the n-MOS transistor structure 12. In the n-MOS transistor structure 12, the source 10 thereof is connected in common with the source 5 of the n-channel MOS transistor 7, and moreover, the back gate 8 of the n-channel MOS transistor 7 is used as a common back gate, and thus all of these are connected in common.

A resistor 15 as an electric current detection unit that detects an electric current flowing to the drain 9 of the n-MOS transistor structure 12 is connected between a terminal B connected to the drain 9 of the n-MOS transistor structure 12 and a power supply voltage potential VDD of the semiconductor integrated circuit.

Herein, the source 5 of the n-channel MOS transistor 7, the source 10 of the n-MOS transistor structure 12 that is connected in common therewith, the gate 11 of the n-MOS transistor structure 12, and the back gate 8 shared by the n-channel MOS transistor 7 and the n-MOS transistor structure 12 are all connected to a negative potential VSS. Further, the P-type substrate layer 1 is connected to a ground potential (GND) via a high-concentration impurity region 14, and the N-type diffusion layer 2 is connected to the power supply voltage potential VDD that is a positive potential via a high-concentration impurity region 13. Moreover, the drain 4 of the n-channel MOS transistor 7 is connected to a terminal A that is to be an input terminal or an output terminal linked to the exterior of the semiconductor integrated circuit.

In this case, in the semiconductor integrated circuit of the present embodiment, a double emitter parasitic npn transistor 21 is formed that uses the drain 4 and the source 5 of the n-channel MOS transistor 7 as a double emitter, the power supply voltage potential VDD to be applied to the N-type diffusion layer 2 as a collector, and the P-type diffusion layer 3 as a base. Further, a parasitic npn transistor 22 that uses the source 10 of the n-MOS transistor structure 12 as an emitter, the drain 9 thereof as a collector, and the P-type diffusion layer 3 as a base, and a parasitic pnp transistor 23 that uses the P-type substrate layer 1 as an emitter, the P-type diffusion layer 3 as a collector, and the N-type diffusion layer 2 as a base, are formed. Further, a parasitic resistance 24 is formed between the P-type substrate layer 1 and the ground potential (GND), a parasitic resistance 25 is formed between the N-type diffusion layer 2 and the power supply voltage potential VDD to be applied thereto, and a parasitic resistance 26 is formed between the P-type diffusion layer 3 and the back gate 8.

Figure 2:
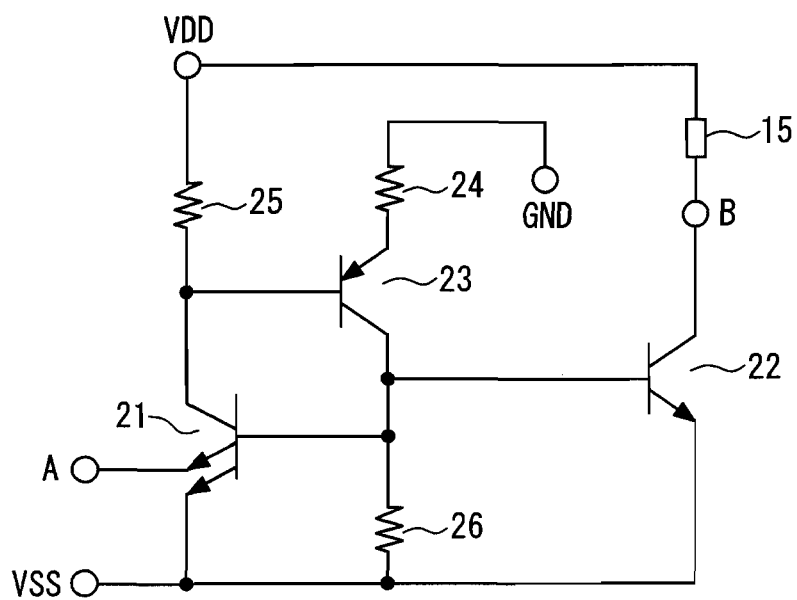
FIG. 2 is an equivalent circuit diagram showing a thyristor structure of the semiconductor integrated circuit according to the first embodiment of the present invention.

FIG. 2 shows a thyristor structure formed by the parasitic elements of the semiconductor integrated circuit of the present embodiment shown in FIG. 1. In FIG. 2, when a voltage lower than VSS is applied to the terminal A of the double emitter parasitic npn transistor 21, a base-emitter (terminal A) voltage increases, so that the parasitic npn transistor 21 is turned on. It is conceived that a base current that flows at this time when the parasitic npn transistor 21 begins to be turned on is supplied from the negative potential VSS.

A collector current of the parasitic npn transistor 21 makes an electric current flow from VDD via the parasitic resistance 25 in the N-type diffusion layer 2 and leads a base current of the parasitic pnp transistor 23 thereinto. When the voltage applied to the terminal A decreases further, the collector current of the parasitic npn transistor 21 increases, and a base potential of the parasitic pnp transistor 23 decreases, so that the parasitic pnp transistor 23 is turned on. A collector current of the parasitic pnp transistor 23 flows from the ground potential (GND) via the parasitic resistance 24 in the P-type substrate layer 1. Further, an emitter current of the parasitic pnp transistor 23 flows to the parasitic resistance 26 in the P-type diffusion layer 3 and to the base of the parasitic npn transistor 21.

As a result, a latch up state is reached in which a base potential of the parasitic npn transistor 21 increases, and even with no voltage applied from the terminal A, an electric current continues to flow to an emitter terminal of the parasitic npn transistor 21, which is connected to the negative potential VSS. As described above, according to a similar principle to that of the case of the conventional semiconductor integrated circuit with a triple well configuration, when a potential lower than VSS that is a negative potential is applied to the terminal A that is connected to an input/output terminal connected to the exterior, latch up occurs in the n-channel MOS transistor 7.

Upon the occurrence of the latch up, an electric current flowing through the parasitic resistance 26 in the P-type diffusion layer 3 becomes large, and a base-emitter voltage of the parasitic npn transistor 22 increases, so that the parasitic npn transistor 22 is turned on.

Since this causes an electric current to flow to the terminal B, a voltage drop occurs at a resistor 15 that is an electric current detection unit. For example, the resistor 15 is set to have a somewhat high resistance value, and thus the potential of a point B becomes substantially equal to VSS. Meanwhile, when latch up has not occurred in the n-channel MOS transistor 7, the parasitic npn transistor 22 has not been turned on, and thus an electric current flowing to the terminal B has a value of 0, making the potential of the terminal B equal to the VDD potential. As described above, when the potential of the point B is substantially equal to VSS, it can be judged that latch up has occurred, while when the potential of the point B is equal to VDD, it can be judged that latch up has not occurred. Therefore, in the semiconductor integrated circuit of the present embodiment, it is possible to detect the occurrence of latch up in the n-channel MOS transistor 7 by the latch up detection circuit composed of the n-MOS transistor structure 12 formed on the P-type diffusion layer 3 on which the n-channel MOS transistor 7 also is formed and the resistor 15 that is the electric current detection unit.

FIG. 3 shows an example of a configuration of the latch up detection circuit in the semiconductor integrated circuit of the present embodiment.

Figure 3A:
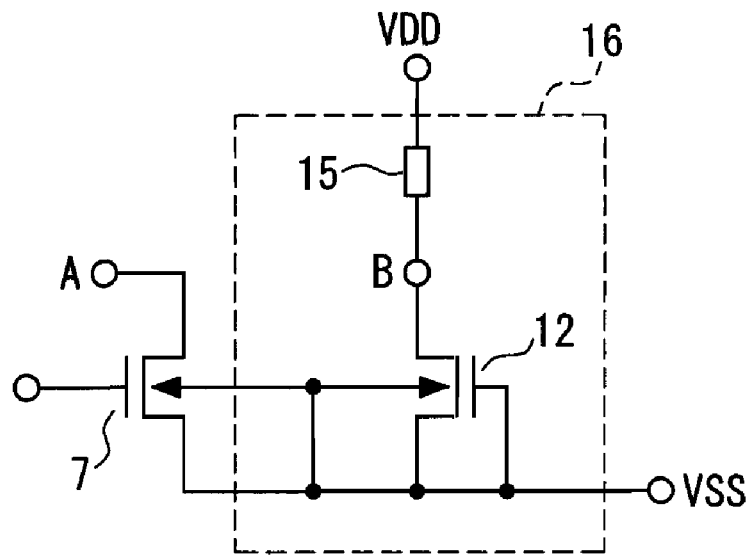
FIG. 3A shows the case where an electric current detection unit is a resistor.

FIG. 3A shows an example of the configuration of a latch up detection circuit 16 in the above-described embodiment shown in FIGS. 1 and 2. As shown in FIG. 3A, the n-MOS transistor structure 12 and the resistor 15 constitute the latch up detection circuit 16. The n-MOS transistor structure 12 is formed on the P-type diffusion layer 3 on which the n-channel MOS transistor 7 with respect to which the detection of the occurrence of latch up is performed also is formed, and its source and back gate are connected in common with the n-channel MOS transistor 7. The resistor 15 has one end connected to the drain of the n-MOS transistor structure 12 and the other end connected to the power supply voltage potential of the semiconductor integrated circuit.

In the latch up detection circuit 16 shown in FIG. 3A, as described above, the potential of the resistor 15 is measured, and when this potential is equal to VDD, it can be judged that latch up has not occurred, while when the potential of the resistor 15 is equal to VSS, it can be judged that latch up has occurred.

Figure 3B:
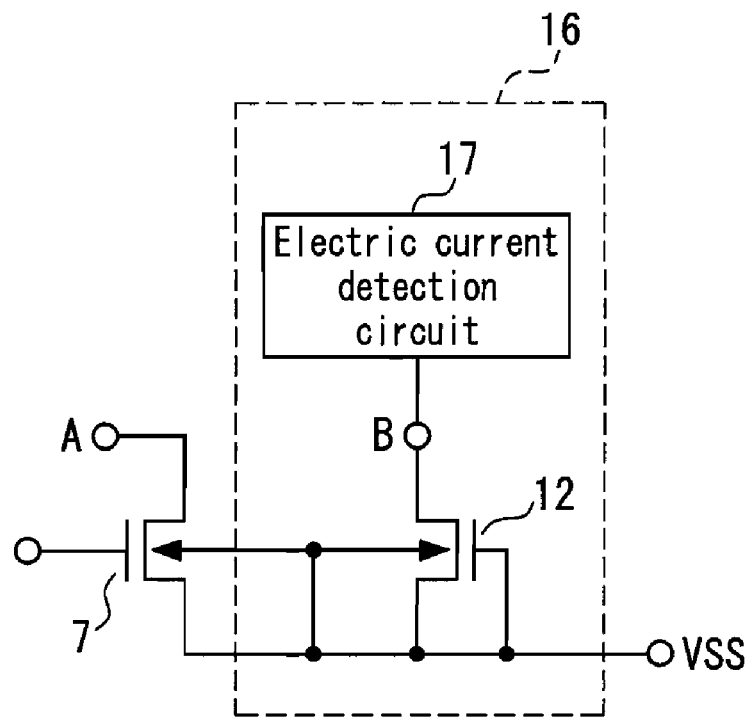
FIG. 3B shows the case where the electric current detection unit is an electric current detection circuit.

FIG. 3B is a circuit block diagram showing another example of the configuration of the latch up detection circuit 16, which is applicable to the semiconductor integrated circuit of the present embodiment. As shown in FIG. 3B, the latch up detection circuit 16 having this configuration as another example is constituted by: the n-MOS transistor structure 12 that is formed on the P-type diffusion layer 3 on which the n-channel MOS transistor 7 with respect to which the detection of latch up is performed also is formed, and whose source and back gate are connected in common with the n-channel MOS transistor 7; and an electric current detection circuit 17 as an electric current detection unit that is connected to the drain of the n-MOS transistor structure 12.

As the electric current detection circuit 17 that is the electric current detection unit in this configuration example of the latch up detection circuit 16 shown in FIG. 3B, for example, a current mirror-type electric current detection circuit can be used. The electric current detection circuit 17 is used to detect whether an electric current is flowing at the point B, and when an electric current is not flowing at the point B, it is judged that latch up has not occurred, while when an electric current is flowing at the point B, it is judged that latch up has occurred, thereby allowing the occurrence of latch up in the n-channel MOS transistor 7 to be detected.

The above-described latch up detection circuit 16 according to the present embodiment allows the occurrence of latch up to be detected without exerting an influence on a structure of the n-channel MOS transistor 7 itself, which respect to which the detection of the occurrence of latch up is performed. Therefore, even when in designing the n-channel MOS transistor 7, layout structural consideration is given in which the parasitic resistance 25 in the N-type diffusion layer 2 and the parasitic resistance 26 in the P-type diffusion layer 3 are set to have a lower resistance value so that the occurrence of latch up can be suppressed, the occurrence of latch up can be detected reliably.

In the latch up detection circuit 16 according to the present embodiment, the n-MOS transistor structure 12 formed on the P-type diffusion layer 3 has the same configuration as that of the n-channel MOS transistor 7, and each of the resistor 15 and the electric current detection circuit 17 that are used as the electric current detection unit can be formed easily as a circuit element formed on the semiconductor substrate. Therefore, when fabricating a semiconductor integrated circuit, the latch up detection circuit 16 shown in the present embodiment can be formed easily by modifying a mask pattern defining a circuit configuration and a circuit arrangement of the semiconductor integrated circuit, thus causing no such detriment as a considerable cost increase.

Furthermore, although the above-described present embodiment describes the case where VSS is defined as a negative potential, the latch up detection circuit 16 of the present invention is not limited to this case. Regardless of whether the potential of VSS is a positive potential or a negative potential, the present invention is applicable to any type of semiconductor integrated circuit with a triple well structure as long as it has a configuration in which a latch up current flows into the source 5 of the n-channel MOS transistor 7 formed on the P-type diffusion layer 3, and thus allows the occurrence of latch up to be detected.

Second Embodiment

Figure 4:
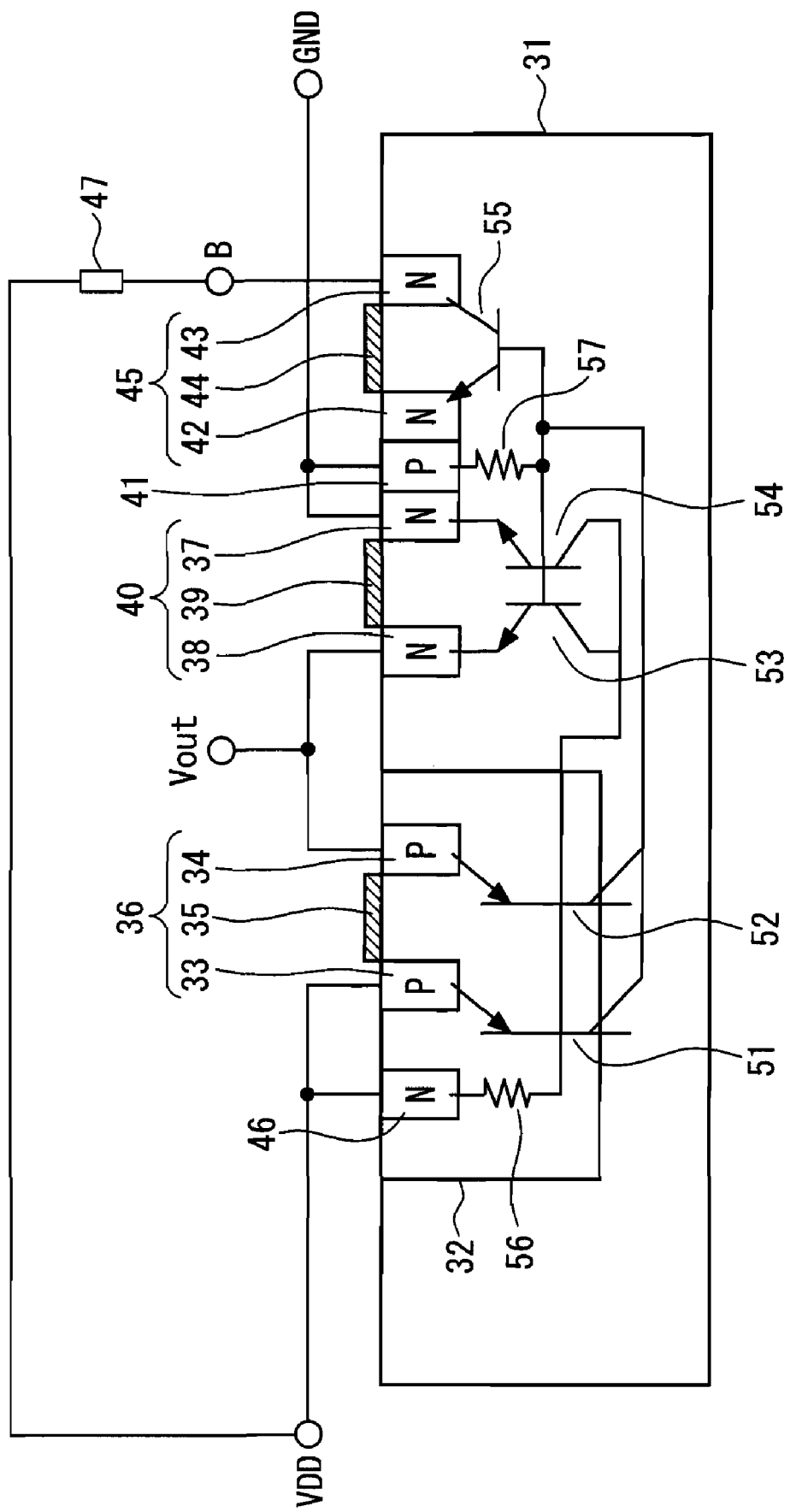
FIG. 4 is a partial enlarged cross-sectional structural view of a semiconductor integrated circuit according to a second embodiment of the present invention.

The description is directed next to a case as a second embodiment of the semiconductor integrated circuit of the present invention, in which the semiconductor integrated circuit of the present invention is applied to a CMOS integrated circuit. FIG. 4 is an enlarged cross-sectional structural view of a portion of a CMOS integrated circuit that represents the second embodiment of the present invention, in which a n-channel MOS transistor, a p-channel MOS transistor, and a latch up detection circuit that detects the occurrence of latch up in the n-channel MOS transistor, are formed.

As shown in FIG. 4, the CMOS integrated circuit of the present embodiment is constituted by forming a N-type diffusion (N-well) layer 32 in a P-type substrate (P-sub) layer 31.

In the N-type diffusion layer 32, a source 33 and a drain 34 are formed by implanting a P-type impurity. A gate 35 is formed on a portion of a substrate between the source 33 and the drain 34 via an unshown insulating film, thereby constituting a p-channel MOS transistor 36.

In the P-type substrate layer 31, a source 37 and a drain 38 are formed by implanting a N-type impurity, and a gate 39 is formed between the source 37 and the drain 38 via an unshown insulating film, thereby constituting a n-channel MOS transistor 40. Further, a back gate 41 that is a P-type contact region is formed in the vicinity of the source 37.

A n-MOS transistor structure 45 is formed in proximity to the n-channel MOS transistor 40 on the P-type substrate layer 31. The n-MOS transistor structure 45 has the same configuration as that of the n-channel MOS transistor 40, i.e. has a source 42 and a drain 43 that are formed by implantation of a N-type impurity and a gate 44 that is formed on a portion of the substrate between the source 42 and the drain 43 via an unshown insulating film. Similarly to the n-MOS transistor structure formed in the semiconductor integrated circuit with the triple well structure described as the first embodiment, while having completely the same configuration as that of the n-channel MOS transistor 40, the n-MOS transistor structure 45 does not function as a transistor that is a circuit element in the semiconductor integrated circuit and is intended only to detect the occurrence of latch up in the n-channel MOS transistor 40 that is in proximity thereto.

In the n-MOS transistor structure 45, the source 42 thereof is connected in common with the source 37 of the n-channel MOS transistor 40, and moreover, the back gate 41 of the n-channel MOS transistor 40 is used as a common back gate.

A resistor 47 as an electric current detection unit that detects an electric current flowing to the drain 43 of the n-MOS transistor structure 45 is connected between a terminal B connected to the drain 43 of the n-MOS transistor 45 and a power supply voltage potential VDD of the semiconductor integrated circuit.

In this CMOS integrated circuit shown in FIG. 4, the source 33 of the p-channel MOS transistor 36 and a N-contact region 46 in the N-type diffusion layer 32 are connected to the power supply voltage potential VDD that is a positive potential. Further, the source 37 of the n-channel MOS transistor 40 on the P-type substrate layer 31, the back gate 41, the source 42 and the gate 44 of the n-MOS transistor structure 45 are connected to a ground potential (GND). The drain 34 of the p-channel MOS transistor 36 and the drain 38 of the n-channel MOS transistor 40 are connected to an output terminal Vout of the CMOS integrated circuit.

In this case, in the CMOS integrated circuit, a first parasitic pnp transistor 51 that uses the source 33 of the p-channel MOS transistor 36 as an emitter, the N-type diffusion layer 32 as a base, and the P-type substrate layer 31 as a collector, and a second parasitic pnp transistor 52 that uses the drain 34 of the p-channel MOS transistor 36 as an emitter, the N-type diffusion layer 32 as a base, and the P-type substrate layer 31 as a collector, are generated. Further, a first parasitic npn transistor 54 that uses the source 37 of the n-channel MOS transistor 40 as an emitter, the P-type substrate layer as a base, and the N-type diffusion layer 32 as a collector, and a second parasitic npn transistor 53 that uses the drain 38 of the n-channel MOS transistor 40 as an emitter, the P-type substrate layer 31 as a base, and the N-type diffusion layer 32 as a collector, are generated.

Moreover, a third parasitic npn transistor 55 is formed that uses the source 42 of the n-MOS transistor structure 45 as an emitter, the drain 43 as a collector, and the P-type diffusion layer 31 as a base. Further, a parasitic resistance 56 is formed between the N-contact region 46 in the N-type diffusion layer 32 and the N-type diffusion layer 32, and a parasitic resistance 57 is formed between the back gate 41 and the P-type substrate layer 31.

Figure 5:
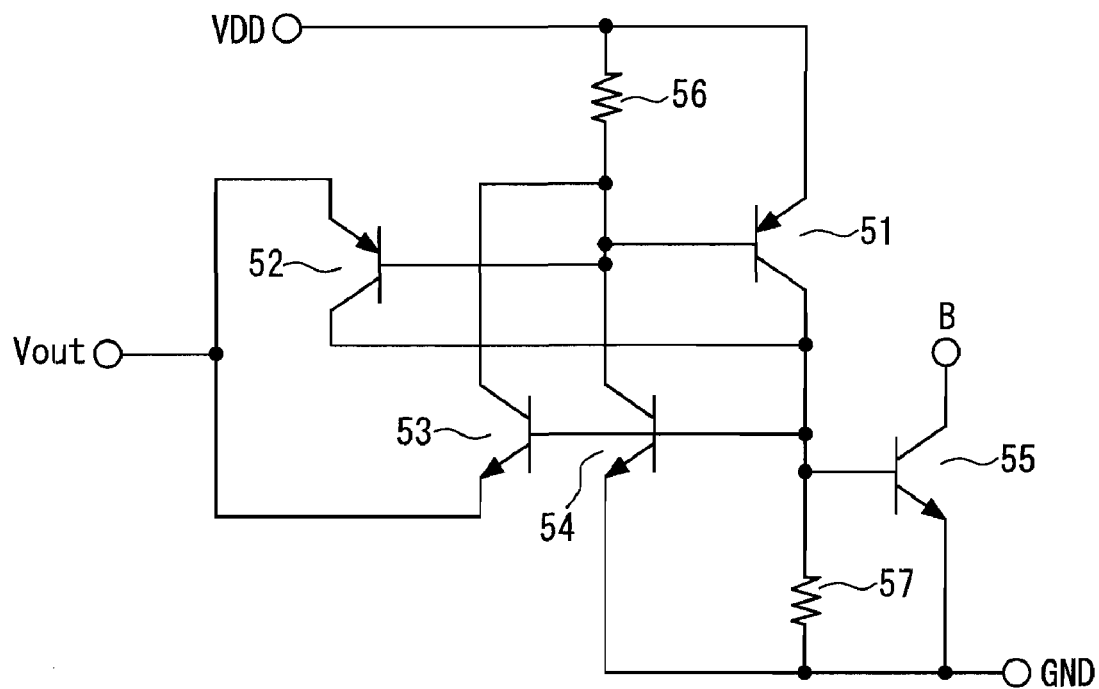
FIG. 5 is an equivalent circuit diagram showing a thyristor structure of the semiconductor integrated circuit according to the second embodiment of the present invention.

FIG. 5 shows a thyristor structure of the parasitic elements generated in the CMOS integrated circuit shown in FIG. 4.

When a potential of the output terminal Vout becomes higher than the power supply voltage potential VDD, a trigger current flows in from the emitter of the second parasitic pnp transistor 52 and flows through the parasitic resistance 57, thus causing a voltage drop. Due to this voltage drop, a base potential of the second parasitic npn transistor 54 increases, so that the second parasitic npn transistor 54 is turned on. When the second parasitic npn transistor 54 is turned on, a collector current of the second parasitic npn transistor 54 flows through the parasitic resistance 56, so that the second parasitic npn transistor 54 is kept in an ON state, leading to the occurrence of latch up.

At the occurrence of the latch up, a base potential of the third parasitic npn transistor 55 increases, so that the third parasitic npn transistor 55 is turned on, thus causing an electric current to flow to the terminal B. As described above, also in the CMOS integrated circuit that represents the second embodiment, similarly to the above-described case of the first embodiment, it can be detected that latch up has occurred in the n-channel MOS transistor 40 based on an electric current flowing to the drain of the n-MOS transistor structure 45 that is formed on the P-type substrate layer 31 in which the n-channel MOS transistor 40 also is formed, and whose source and back gate are connected in common with the n-channel MOS transistor 40.

With respect to an electric current flowing to the drain of the n-MOS transistor structure 45, when a potential at the resistor 47 as one example of the electric current detection unit that has one end connected to the drain of the n-MOS transistor structure 45 and the other end connected to the positive power supply potential of the semiconductor integrated circuit as shown in FIG. 4 is equal to VDD, it can be judged that latch up has not occurred, while when the potential is equal to VSS, it can be judged that latch up has occurred.

In the second embodiment, though not explained with reference to the drawings, similarly to the configuration shown in FIG. 3B with regard to the first embodiment, as the electric current detection unit that constitutes the latch up detection circuit together with the n-MOS transistor structure, an electric current detection circuit such as a current mirror circuit, which is connected to the drain 43 of the n-MOS transistor structure 45, can be used. This electric current detection circuit is used to detect whether an electric current is flowing at the terminal B connected to the drain 43 of the n-MOS transistor structure 45, and when an electric current is not flowing at the terminal B, it is judged that latch up has not occurred, while when an electric current is flowing at the terminal B, it is judged that latch up has occurred, thereby allowing the occurrence of latch up in the n-channel MOS transistor to be detected.

As described above, also in the second embodiment of the present invention, without depending on a structure of the n-channel MOS transistor with respect to which the detection of the occurrence of latch up is performed, the occurrence of latch up in the n-channel MOS transistor 40 can be detected by the n-MOS transistor structure 45 provided in proximity thereto and the electric current detection unit 47. Therefore, it is possible to detect the occurrence of latch up reliably while concurrently giving layout structural consideration for preventing the occurrence of latch up, in which the parasitic resistance 56 in the N-type diffusion layer 32 and the parasitic resistance 57 in the P-type substrate layer 31 are set to have a low resistance value.

Although the above-described second embodiment uses a substrate configuration in which the N-type diffusion layer 32 is formed on the P-type substrate layer 31, the present invention is not limited thereto and is applicable also to a CMOS integrated circuit in which the n-channel MOS transistor 40 is formed on a P-type diffusion layer.

Furthermore, the present invention is applicable also to any other type of semiconductor integrated circuit as long as it has a configuration in which a latch up current flows into a source of a n-channel MOS transistor formed in a P-type region on a semiconductor substrate, such as a P-type substrate layer, a P-type diffusion layer or the like, and thus allows latch up in the n-channel MOS transistor to be detected easily and reliably.

Third Embodiment

Next, with reference to the drawings, the following describes a configuration as a third embodiment of the semiconductor integrated circuit of the present invention, for making a recovery from latch up in the semiconductor integrated circuit of the present invention.

Figure 6:
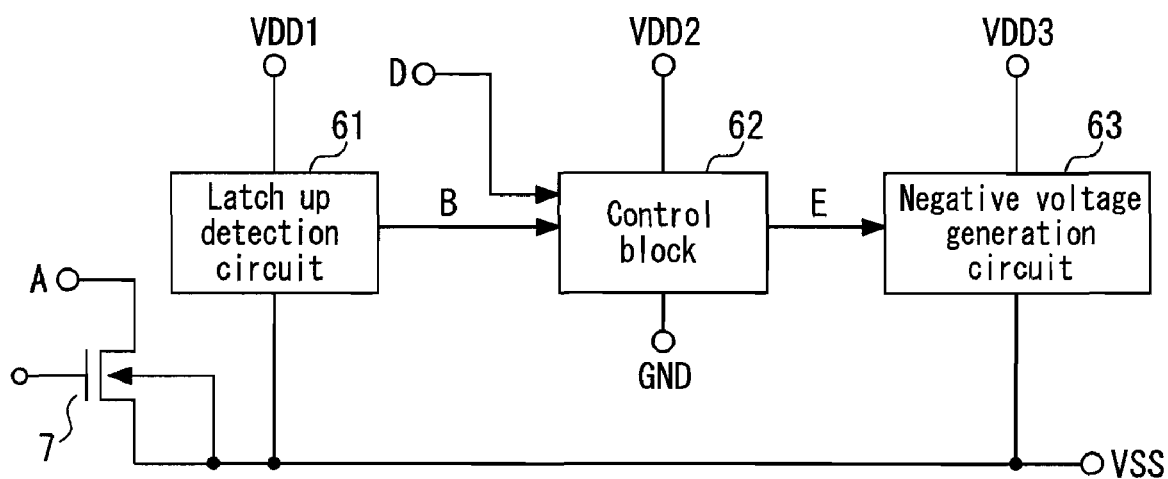
FIG. 6 is a block structural diagram showing a circuit configuration for detecting the occurrence of latch up and for allowing the latch up to cease in a semiconductor integrated circuit according to a third embodiment of the present invention.
Figure 7:
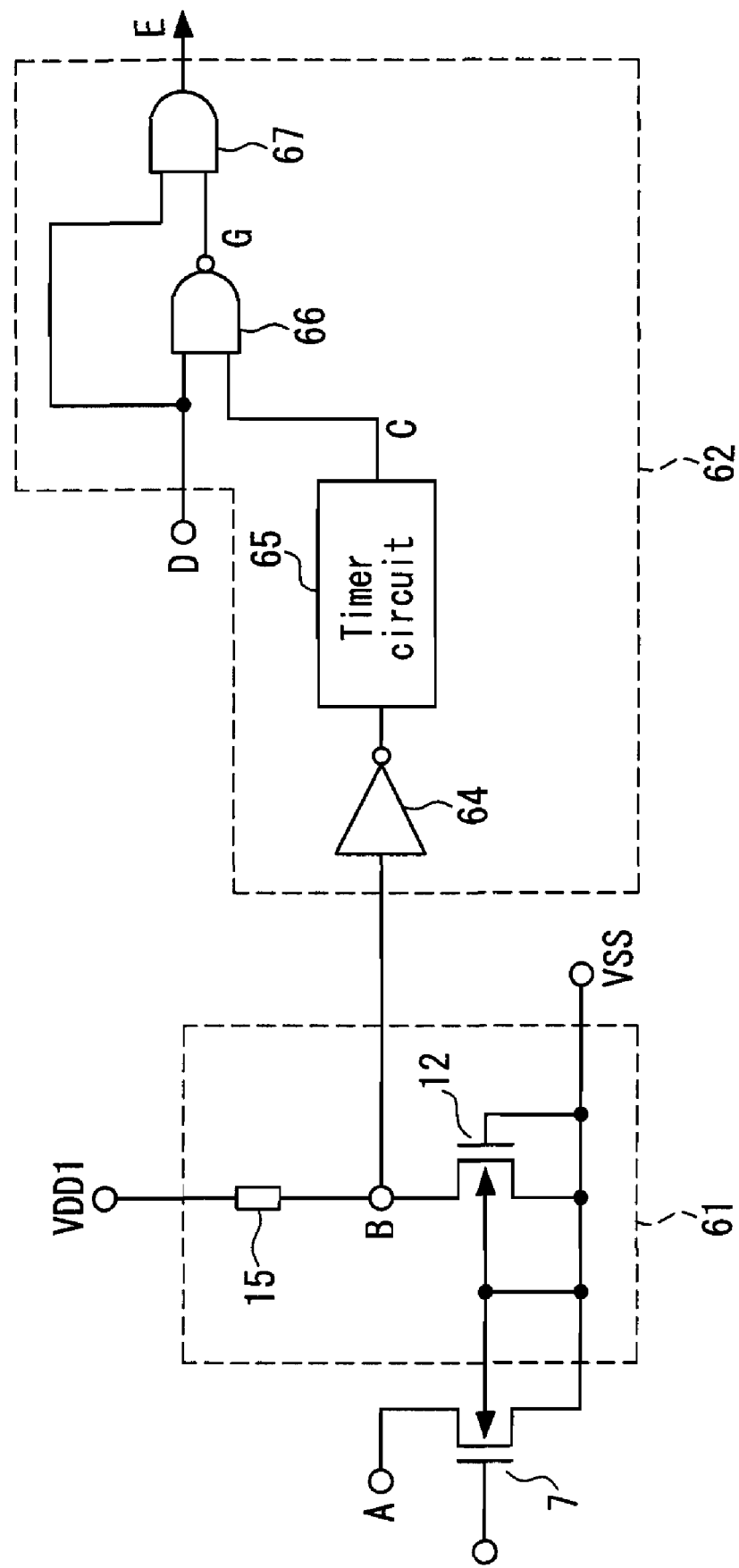
FIG. 7 is a block diagram showing an example of a detailed circuit configuration of a latch up detection circuit and a control block in the semiconductor integrated circuit according to the third embodiment of the present invention.

FIG. 6 is a circuit block diagram showing a circuit configuration in a semiconductor integrated circuit that represents the third embodiment of the present invention, for detecting the occurrence of latch up in a n-channel MOS transistor 7 and for making a recovery from the latch up. Further, FIG. 7 is a block diagram showing a detailed configuration of a latch up detection circuit 61 and a control block 62 in the semiconductor integrated circuit of the present embodiment.

As shown in FIG. 6, the semiconductor integrated circuit of the present embodiment has the n-channel MOS transistor 7 formed in a P-type region on a semiconductor substrate, such as a P-type substrate layer, a P-type diffusion layer or the like, the latch up detection circuit 61 that detects the occurrence of latch up in the n-channel MOS transistor 7, the control block 62 that controls ON/OFF of a negative potential VSS of the semiconductor integrated circuit in accordance with an output signal from the latch up detection circuit 61, and a negative voltage generation circuit 63 that generates the negative potential VSS and halts the generation thereof based on a control signal from the control block 62.

The latch up detection circuit 61 can be formed of any type of circuit with no particular limitation as long as it detects the occurrence of latch up in the n-channel MOS transistor. In the explanation of the present embodiment, as shown in a specific configuration example in FIG. 7, the latch up detection circuit 61 is used that has a n-MOS transistor structure 12 as described above in the first embodiment, in which a source and a back gate are connected in common with the n-channel MOS transistor 7 which respect to which the detection is performed, and a resistor 15 as an electric current detection unit that detects an electric current at a drain of the n-MOS transistor structure 12 (B terminal in the figure). The latch up detection circuit 61 operates between a power supply voltage VDD1 and the negative potential VSS that is an output of the negative voltage generation circuit 63.

The control block 62 has an inverter 64 connected to the terminal B that is an output of the latch up detection circuit 61, a timer circuit 65 connected to an output of the inverter, a NAND circuit 66 to which an output C of the timer circuit 65 and an output signal of a mode control terminal D, which performs a mode control on the generation of a negative voltage and deactivation, are inputted, and an AND circuit 67 to which an output G of the NAND circuit 66 and an output signal of the mode control terminal D are inputted. The control block 62 operates between a power supply voltage VDD2 and a ground potential (GND), and outputs a Hi/Lo control voltage to an output terminal E using an output of the terminal B that is the output of the latch up detection circuit 61 as an input signal. At this time, Hi corresponds to the level of the power supply voltage VDD2 for the control block 62, and Lo corresponds to the level of the ground potential (GND).

The negative voltage generation circuit 63 is connected to the output terminal point E of the control block 62, and when an output signal from the control block 62 is Hi, it generates and outputs the negative potential VSS. The negative voltage generation circuit 63 uses VDD3 as a power supply and is formed of, for example, a reversal charge pump circuit.

A terminal A is connected to an input/output terminal of the semiconductor integrated circuit and thus is connected to an external circuit of the semiconductor integrated circuit.

Figure 8:
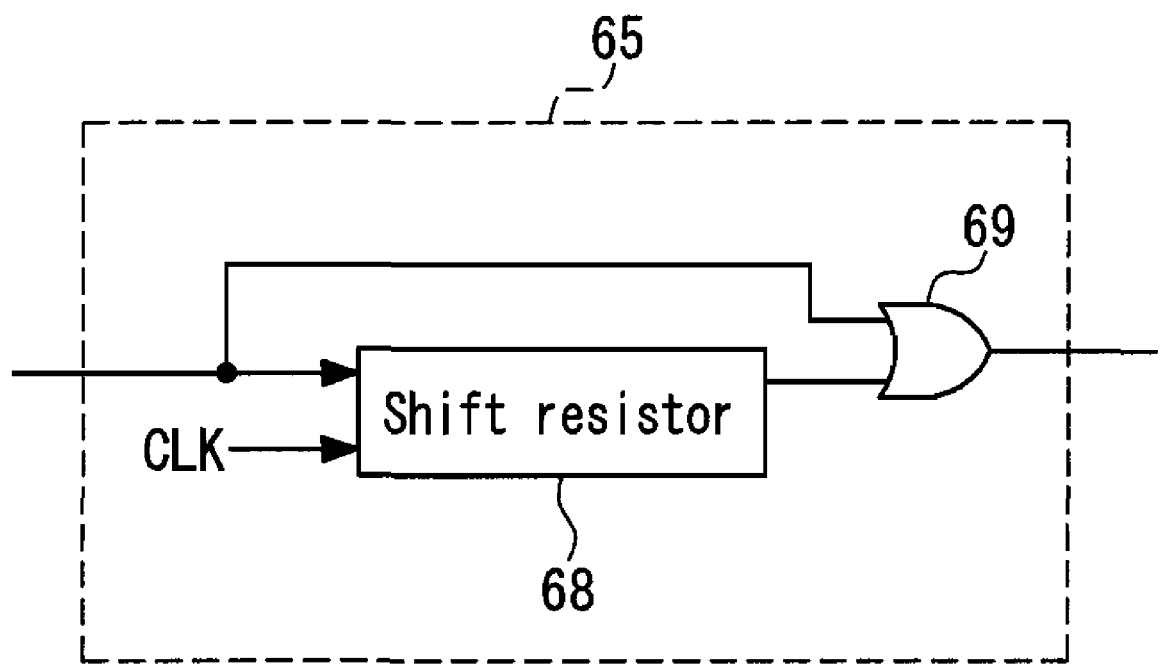
FIG. 8 is a block diagram showing an example of a configuration of a timer circuit in the semiconductor integrated circuit according to the third embodiment of the present invention.

FIG. 8 shows an example of a configuration of the timer circuit 65 used in the control block 62. As shown in FIG. 8, the timer circuit 65 can be constituted of for example, a shift resistor 68 and an OR circuit 69. The shift resistor 68 is configured in a general flip-flop form and uses a clock pulse (CLK).

In the timer circuit 65 having the above-described configuration, in the OR circuit 69, an OR operation is performed on an input signal and an input signal delayed in the shift resistor 68, and based thereon, an output can be performed in such a manner as to output Hi when the input signal is Hi, output Hi for a given length of time even after the input signal has shifted from Hi to Lo, and output Lo thereafter. A delay time can be changed appropriately to a desired length of time depending on the number of flip-flops or the frequency of a clock pulse.

Figure 9:
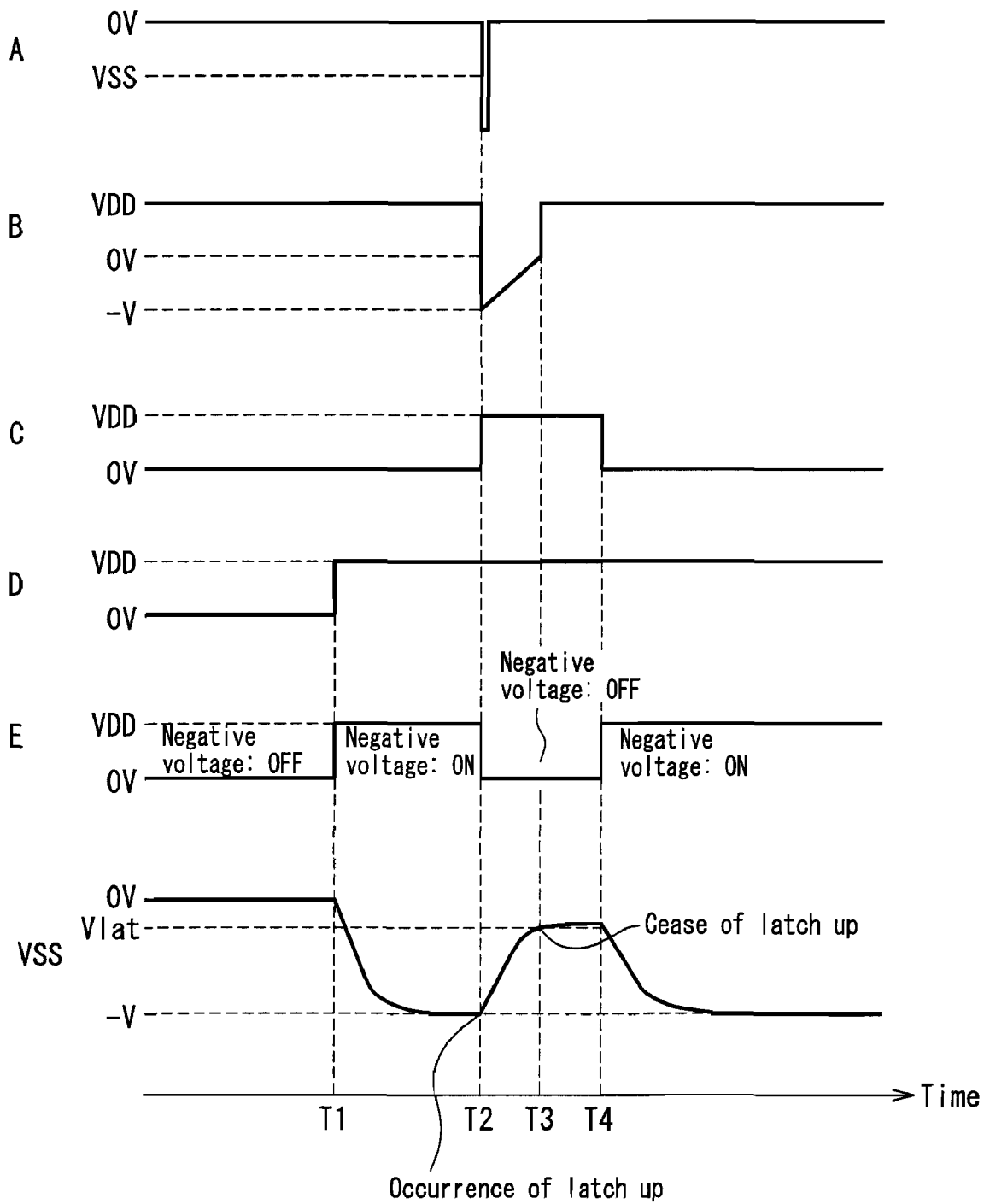
FIG. 9 is a time chart showing an operation of the semiconductor integrated circuit according to the third embodiment of the present invention.

The following describes an operation of the semiconductor integrated circuit of the present embodiment having the above-described configuration. FIG. 9 is a time chart showing an operation in the semiconductor integrated circuit according to the present embodiment. In FIG. 9, A to E indicate the respective voltages at points A to E shown in FIGS. 6 and 7, and VSS indicates a negative potential that is the output of the negative voltage generation circuit 63.

At a time T1, when a control voltage of the terminal D becomes Hi, the output E of the control block 62 outputs Hi, and the negative voltage generation circuit 63 starts charging of a negative potential with respect to the VSS terminal.

It is assumed that at a time T2, a voltage lower than the negative potential VSS is applied to the point A connected to an external terminal, so that latch up occurs. At this time, the output B of the latch up detection circuit 61 outputs a negative voltage −V that is substantially equal to VSS. The potential of B becomes a negative potential lower than 0 V during a time period from T2 to T3 in which the latch up persists.

Since the output B is a negative potential, in the control block 62, the timer circuit 65 that outputs Lo when in a normal state outputs Hi. In the present embodiment, a timer is set to have a delay time period that is a time width between T3 and T4. As a result, at T2 when the output B of the latch up detection circuit 61 becomes a negative value, the output C of the timer circuit 65 becomes Hi, and during period of time up to T4 even after T3 when the output B of the latch up detection circuit 61 no longer is a negative value, the output C of the timer circuit 65 continues to be Hi and then returns to Lo.

During a period of time in which the output C of the timer circuit 65 is Hi, the output E of the control block 62 becomes Lo, and during a time period in which the output E of the control block 62 is Lo, the negative voltage generation circuit 63 halts charging of a negative voltage with respect to VSS that is an output terminal. During a period of time in which the charging of a negative voltage is halted, a latch up current and an electric current from any other circuit flow into VSS, and thus the value of VSS increases from −V that is a predetermined value. When the value of VSS becomes higher than, for example, −1 V, latch up ceases, though this value may vary depending on a circuit characteristic attributable to a manufacturing process of a semiconductor integrated circuit. In FIG. 9, a voltage and a time at this moment are indicated as Vlat and T3, respectively.

In the semiconductor integrated circuit of the present embodiment, a time period for making a complete recovery from latch up with sufficient time allowance after the potential Vlat is obtained at which the latch up is conceived to cease is set to be T3 to T4 in the timer circuit 65 of the control block 62. At the time T4, the voltage of the terminal C becomes Lo again, and the control signal E transmits the control voltage Hi as an original voltage to the negative voltage generation circuit 63. Then, the negative voltage generation circuit 63 restarts charging of a negative potential with respect to VSS that is an output thereof.

According to the semiconductor integrated circuit of the present embodiment, in the above-described manner, after the occurrence of latch up has been detected, the supply of VSS that is a negative potential is halted temporarily, and after a lapse of a margin time period in which a complete recovery from a latch up state is made, the supply of VSS is restarted, thereby allowing the recovery from latch up to be achieved. This allows a recovery from latch up to be made reliably and does not require, as a method for making a recovery from latch up, that a power supply voltage potential VDD as a driving power supply of the semiconductor integrated circuit should be cut off. Therefore, the semiconductor integrated circuit of the present embodiment causes no adverse influence resulting from cutting off any circuit block other than a circuit block linked to a negative potential, such as, for example, a circuit block that is set to be in an operation mode of operating between a positive power supply and GND.

The negative voltage generation circuit 63 may be formed on the semiconductor integrated circuit according to the present embodiment or on a circuit substrate of any other semiconductor integrated circuit or the like, as long as it can supply a negative potential VSS and halt the supply thereof.

Fourth Embodiment

Next, with reference to the drawings, the following describes another configuration as a fourth embodiment of the semiconductor integrated circuit of the present invention, for making a recovery from latch up in the semiconductor integrated circuit of the present invention.

Figure 10:
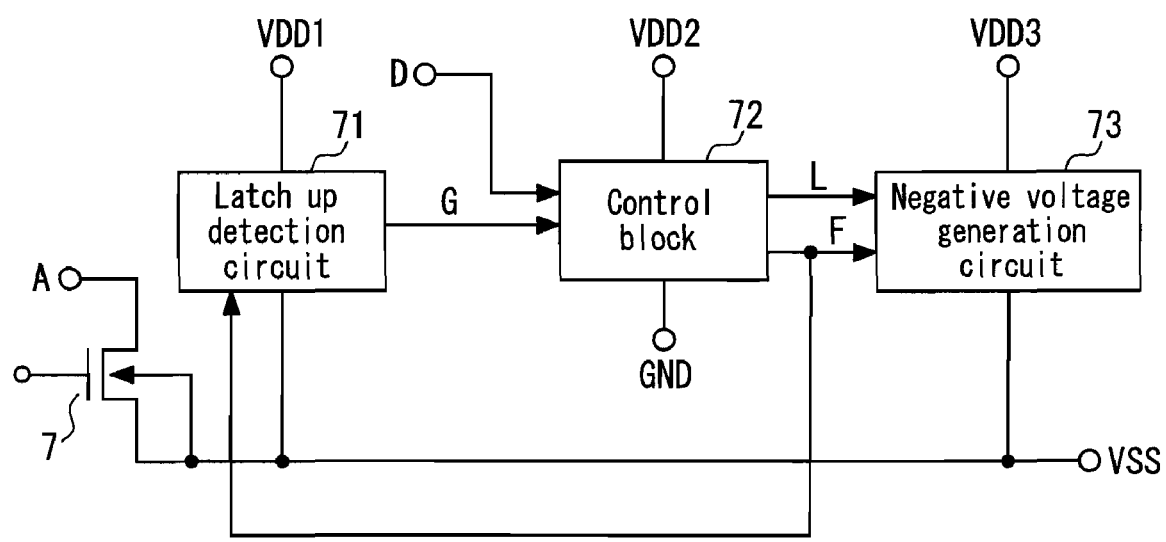
FIG. 10 is a block structural diagram showing a circuit configuration for detecting the occurrence of latch up and for allowing the latch up to cease in a semiconductor integrated circuit according to a fourth embodiment of the present invention.
Figure 11:
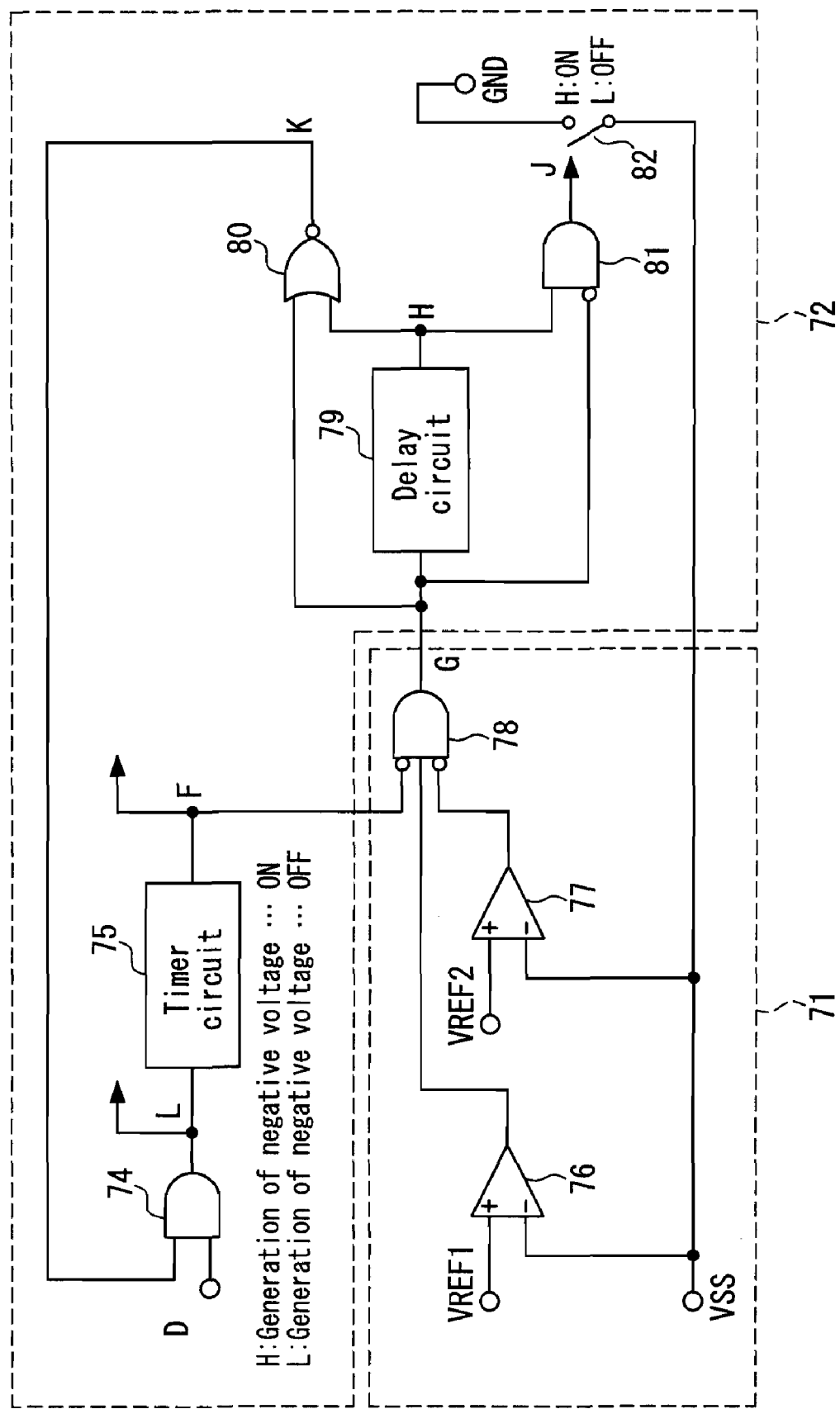
FIG. 11 is a block diagram showing an example of a detailed circuit configuration of a latch up detection circuit and a control block in the semiconductor integrated circuit according to the fourth embodiment of the present invention.

FIG. 10 is a circuit block diagram showing another circuit configuration in a semiconductor integrated circuit that represents the fourth embodiment of the present invention, for detecting the occurrence of latch up in a n-channel MOS transistor 7 and for making a recovery from the latch up. Further, FIG. 11 is a circuit block diagram showing an example of a detailed configuration of a latch up detection circuit 71 and a control block 72 in the semiconductor integrated circuit of the present embodiment.

As shown in FIG. 10, the semiconductor integrated circuit of the present embodiment has the n-channel MOS transistor 7 formed in a P-type region on a semiconductor substrate, such as a P-type substrate layer, a P-type diffusion layer or the like, the latch up detection circuit 71 that detects the occurrence of latch up in the n-channel MOS transistor 7, the control block 72 that controls ON/OFF of a negative potential VSS of the semiconductor integrated circuit in accordance with an output signal from the latch up detection circuit 71, and a negative voltage generation circuit 73 that generates the negative potential VSS and halts the generation thereof based on a control signal from the control block 72. That is, the present embodiment has the same basic circuit block configuration as the above-described circuit configuration of the semiconductor integrated circuit according to the third embodiment described with reference to FIG. 6.

In the semiconductor integrated circuit of the present embodiment, a terminal A is a terminal that is connected to an input/output terminal of the semiconductor integrated circuit and is connected to an external circuit of the semiconductor integrated circuit. A voltage to be a trigger for the occurrence of latch up in the n-channel MOS transistor 7 might be inputted to this terminal.

The latch up detection circuit 71 operates between a power supply voltage VDD1 and an output VSS of the negative voltage generation circuit.

The control block 72 operates between a power supply voltage VDD2 and a ground potential (GND), and an output terminal G of the latch up detection circuit 71 and a control terminal D that performs a mode control on the generation of a negative potential and deactivation are connected thereto. The control block 72 has two output terminals that are a terminal L and a terminal F The terminal L is connected to the negative voltage generation circuit 73, and the terminal F is connected to the negative voltage generation circuit 73 and to the latch up detection circuit 71.

The negative voltage generation circuit 73 is connected to a power supply voltage VDD3 and the ground potential (GND), and an output of the negative voltage generation circuit 73 is the negative potential VSS. The negative voltage generation circuit 73 uses the output terminal L and the output terminal F of the control block 72 as control signals. For example, the negative voltage generation circuit 73 can be formed of a charge pump circuit that is capable of controlling ON and OFF of negative voltage charging based on the control signal L and performing a switching control between high and low charging capabilities based on the control signal F.

As shown in FIG. 11, the latch up detection circuit 71 of the present embodiment has a first comparator 76 that compares VSS with a first reference potential VREF1, a second comparator 77 that compares VSS with a second reference potential VREF2 (where VREF1>VREF2), and a NAND circuit 78 with thee input terminals, two of which are reverse input terminals. An output of the comparator 76 is inputted as it is and an output of the comparator 77 is inputted reversely, to the NAND circuit 78 with three input terminals. At this time, in the case where an output of a later-described timer circuit 75 of the control block 72 is Lo, which is inputted reversely to the other of the reverse input terminals, when VSS has a value within a range between VREF1 and VREF2, the NAND circuit 78 outputs Hi.

The control block 72 has an AND circuit 74, the timer circuit 75, a delay circuit 79, a NOR circuit 80, an AND circuit 81 with two input terminals, one of which is a reverse input terminal, and a short-circuit switch 82 that performs switching between a short-circuited state and an open state of a portion between VSS and the ground potential (GND).

The delay circuit 79 may be formed of, for example, a delayer using a CR time constant, inverters connected in multistage, or the like, and the terminal G that is an output of the latch up detection circuit 71 is an input terminal of the delay circuit 79. An output H of the delay circuit 79 is connected to a forward input of the AND circuit 81, and an input G of the delay circuit 79 is connected to the reverse input of the AND circuit 81. In the case where the output of the AND circuit 81 is Hi, the short-circuit switch 82 is switched on, while in the case where the output of the AND circuit 81 is Lo, the short-circuit switch 82 is switched off.

Furthermore, an input/output terminal H of the delay circuit 79 is connected to the NOR circuit 80, and an output K of the NOR circuit 80 is connected, together with a control terminal D that controls ON/OFF of a negative voltage, to an input of the AND circuit 74.

An output L of the AND circuit 74 is connected to the negative voltage generation circuit 73 and to the timer circuit 75. When an input L changes in level from Lo to Hi, the timer circuit 75 outputs Hi for a given length of time and then its output is changed to Lo. When the input L is Lo, the output of the timer circuit 75 is Lo. An output F of the timer circuit 75 is connected to the negative voltage generation circuit 73 and to one of the reverse inputs of the NAND circuit 78 of the latch up detection circuit 71.

Figure 12:
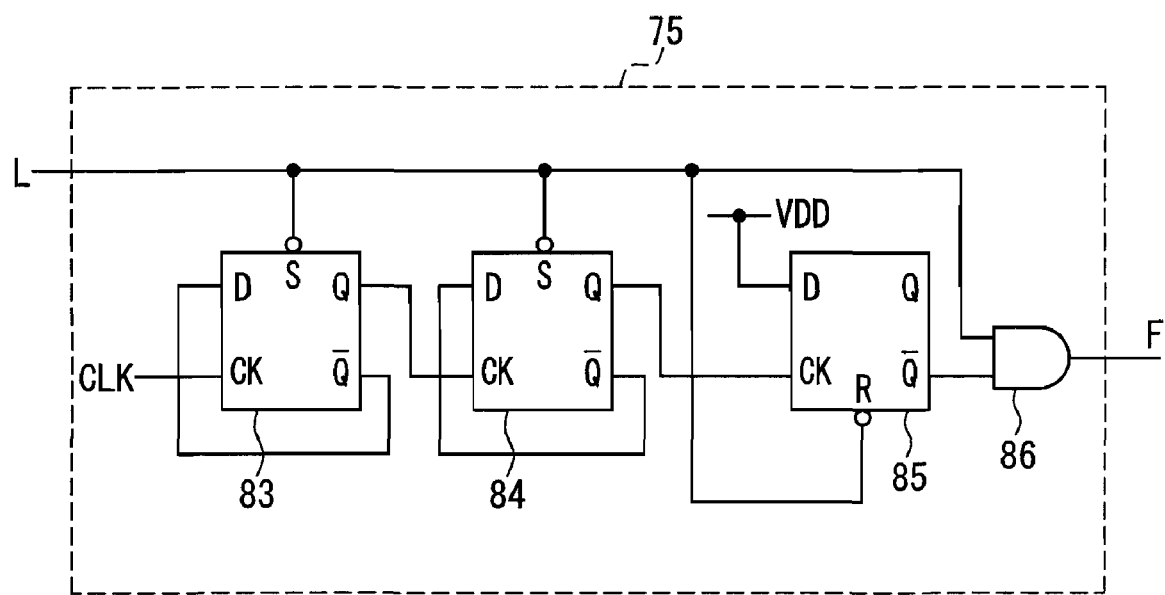
FIG. 12 is a block diagram showing an example of a configuration of a timer circuit in the semiconductor integrated circuit according to the fourth embodiment of the present invention.

FIG. 12 shows an example of a configuration of the timer circuit 75 used in the control block 72 in the semiconductor integrated circuit according to the present embodiment. As shown in FIG. 12, the timer circuit 75 of the present embodiment has two set-type D-flip-flops 83 and 84, a reset-type D-flip-flop 85, and an AND circuit 86.

In each of the two set-type D-flip-flops 83 and 84, a reverse output and a D input are connected to each other, and an input signal L is connected to a set terminal. Further, a clock pulse is inputted to a CK terminal of the set-type D-flip-flop 83 at the first stage, and a forward output of the set-type D-flip-flop 83 at the first stage is connected to a CK terminal of the set-type D-flop-flop 84 at the second stage, thereby allowing a clock frequency divider circuit to be configured.

In the reset-type D-flip-flop 85, a clock pulse obtained by frequency division is connected to a CK terminal, a reset terminal is connected to the input signal L, and a D input is connected to a power supply voltage VDD. A reverse output of the reset-type D-flip-flop 85 and the input signal are inputted to the AND circuit 86.

According to this configuration, when the input signal L changes in level from Lo to Hi, an output F of the AND circuit 86 immediately shifts from Lo to Hi, and even in the case where the input signal L stays Hi for a given length of time or longer, the output F becomes Lo after a lapse of the given length of time. Further, in the case where the input signal L changes in level from Lo to Hi and then becomes Lo within the above-described given length of time, the output becomes Lo immediately. The given length of time set for the above-described operation of the timer circuit 75 can be adjusted through the number of set-type D-flip-flops or the frequency of a clock pulse.

Figure 13:
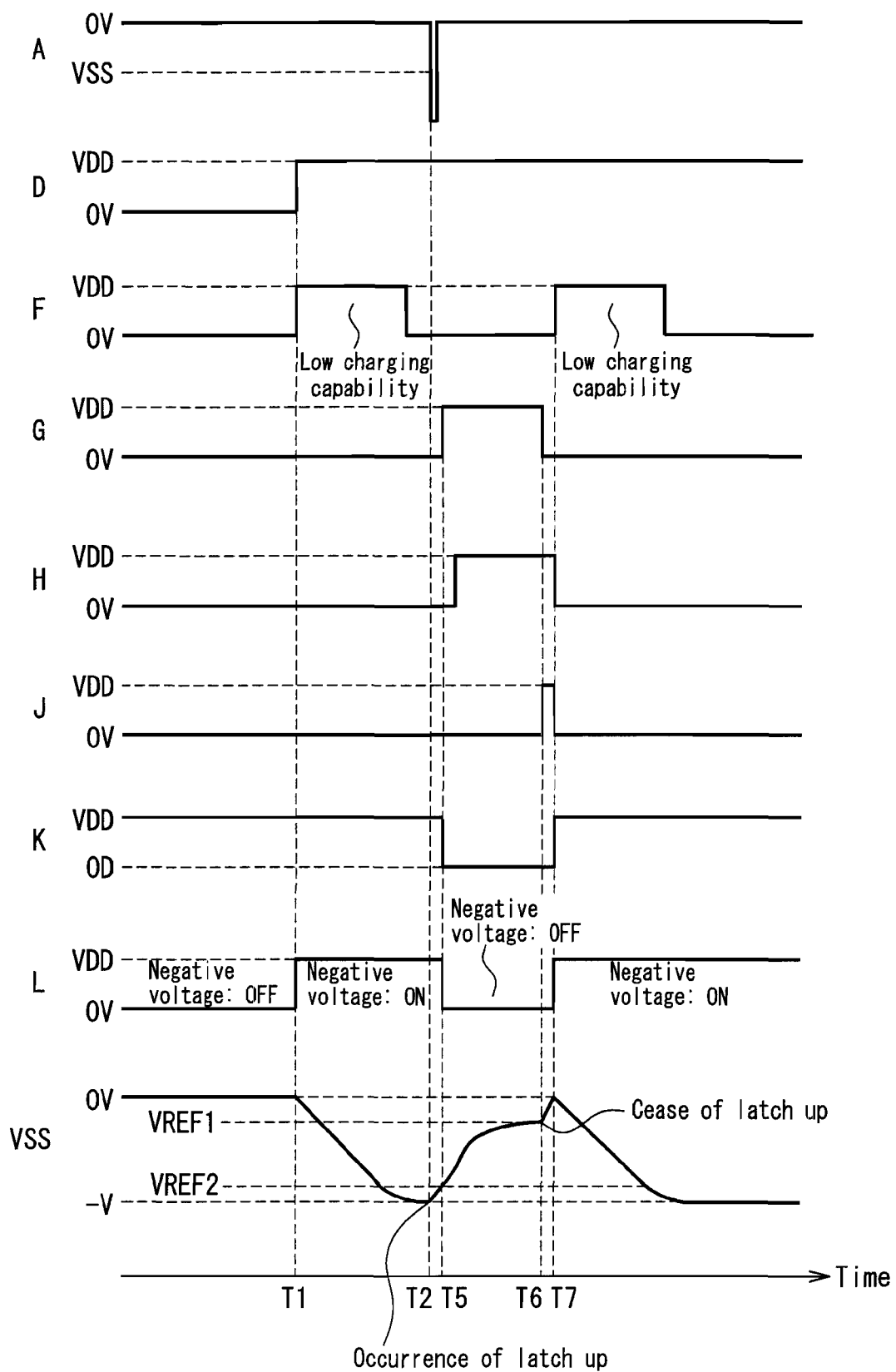
FIG. 13 is a time chart showing an operation of the semiconductor integrated circuit according to the fourth embodiment of the present invention.
Figure 14:
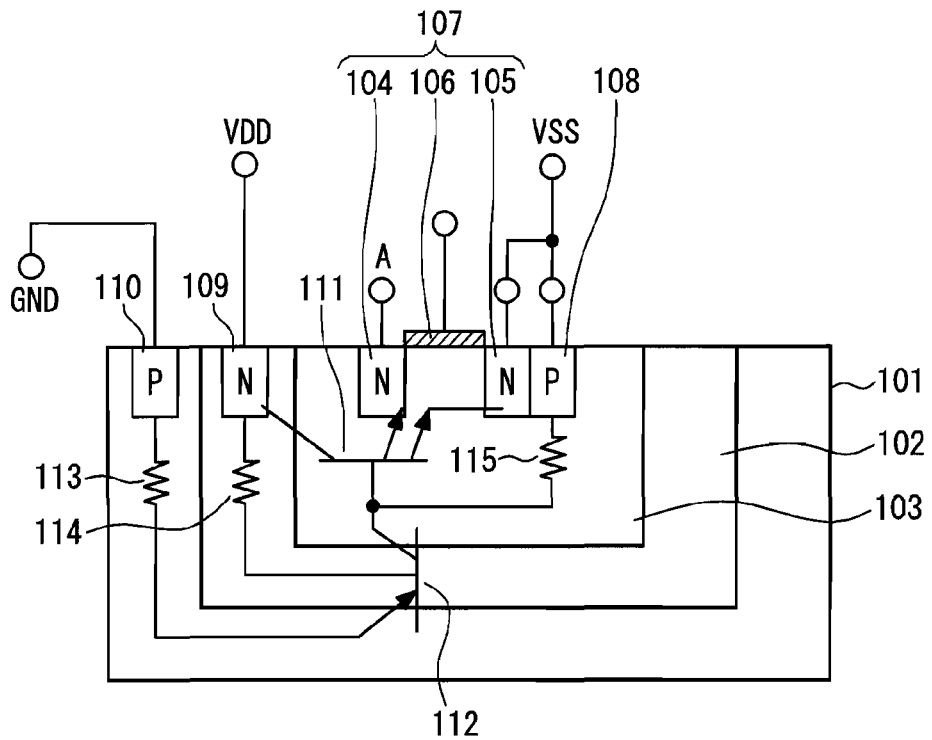
FIG. 14 is a partial enlarged cross-sectional structural view of a conventional semiconductor integrated circuit with a triple well structure.
Figure 15:
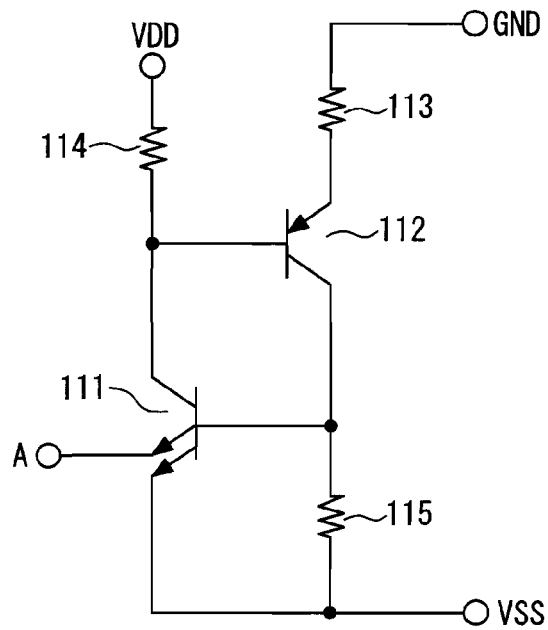
FIG. 15 is an equivalent circuit diagram showing a thyristor structure of the conventional semiconductor integrated circuit with the triple well structure.
Figure 16:
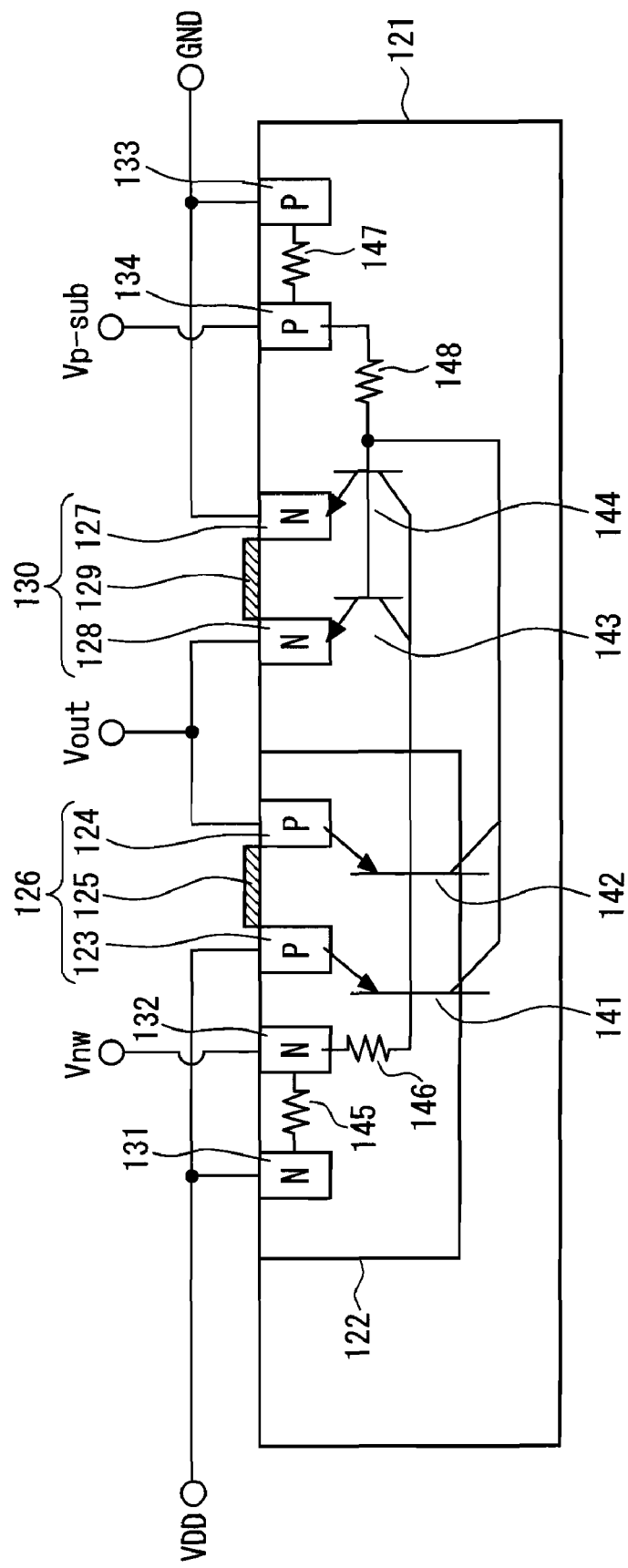
FIG. 16 is a partial enlarged cross-sectional structural view of a conventional CMOS integrated circuit.
Figure 17:
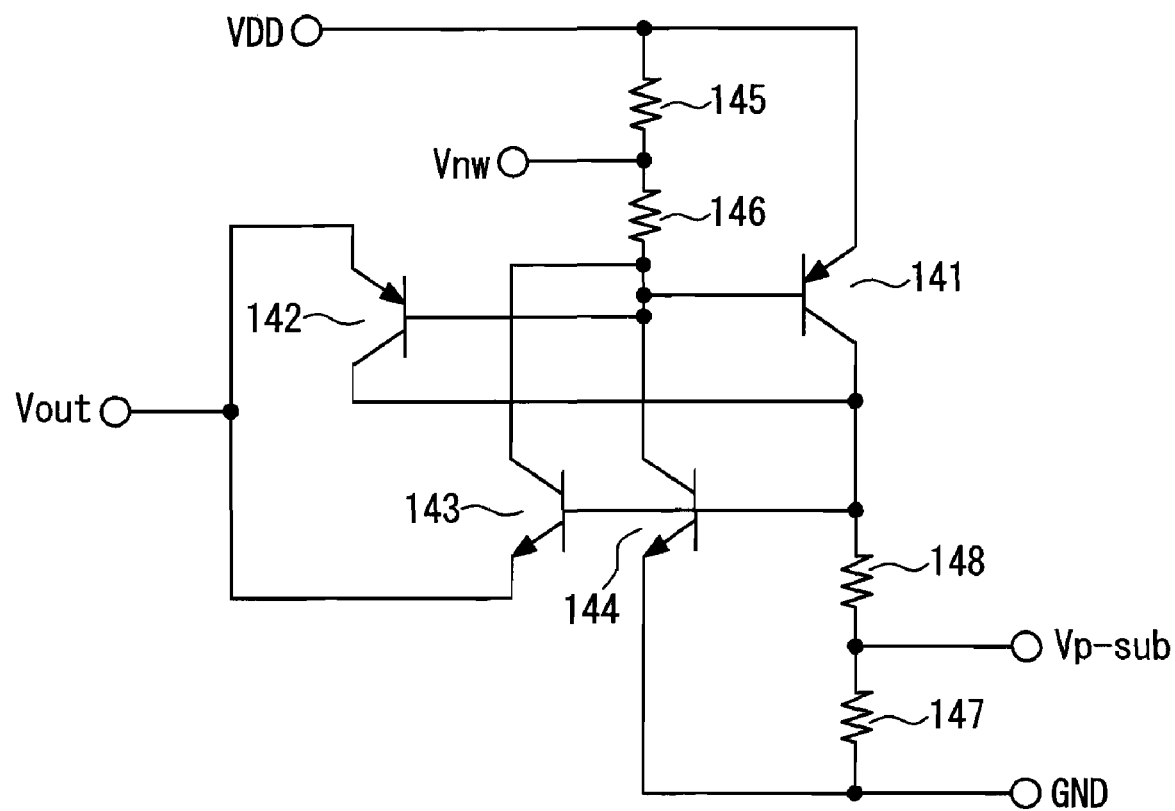
FIG. 17 is an equivalent circuit diagram showing a thyristor structure of the conventional CMOS integrated circuit.

The following describes an operation of the above-described semiconductor integrated circuit of the present embodiment. FIG. 13 is a time chart showing an operation performed in the semiconductor integrated circuit according to the present embodiment. In FIGS. 13, A, D, F, G, H, J, K, and L indicate the respective voltages at corresponding points shown in FIGS. 10 and 11, and VSS indicates a negative potential that is the output of the negative voltage generation circuit 73.

When VSS is 0V, the output K of the NOR circuit 80 is fixed to Hi, and at a time T1 when such a state continues, if a control voltage of the terminal D becomes Hi, an output L of the control block 72 becomes Hi, and an output F that is the other output of the control block 72 also outputs Hi for a given length of time decided in the timer circuit 75, and thus the negative voltage generation circuit 73 starts charging of a negative potential with respect to the VSS terminal. Herein, in a time period in which the outputs L and F of the control block 72 are both Hi, the charging capability of the negative voltage generation circuit 73 is low, and within a time period in which the output F of the control block 72 is Hi, a negative potential can be charged sufficiently. Further, when the output F of the control block 72 becomes Lo after completion of the time period in which the output F is Hi and the output L of the control block 72 is Hi, the charging capability of the negative voltage generation circuit 73 is high.

At a time T2, a voltage lower than the negative potential VSS is applied to the point A connected to an external terminal, so that latch up occurs. At the occurrence of the latch up, an abnormal current flows into VSS and thus the potential of VSS increases, and at a time T5, VSS becomes higher than the second reference potential VREF2, so that an output G of the NAND circuit 78 becomes Hi.

After that, until a time T6 when VSS exceeds the first reference potential VREF1, a time period continues in which the output G of the NAND circuit 78 stays Hi. The first reference potential VREF1 is set to a voltage that is high enough to allow the latch up to cease.

The output G of the NAND circuit 78 is inputted to the delay circuit 79 where a delay of a predetermined delay time that is a period of time from T6 to T7 in the present embodiment is applied thereto. The output K of the NOR circuit 80 to which an input/output of the delay circuit 79 is inputted becomes Lo during a period of time from a time T5 to a time T7, and the output L of the AND circuit 74 becomes Lo. As a result of this, during the period of time from T5 to T7, the negative voltage generation circuit 73 halts charging of a negative potential. Further, an output J of the AND circuit 81 becomes Hi during a period of time from a time T6 to the time T7, so that the short-circuit switch 82 that performs switching between a short-circuited state and an open state of VSS and the ground potential is opened, and thus VSS shifts to a ground potential level. With VSS shifted to the ground potential level, the latch up ceases completely.

At the time T7, the output K of the NOR circuit 80 becomes Hi and the control signal D stays Hi, and thus the output L of the AND circuit 74 becomes Hi again. At this time, the terminal L and the terminal F that are linked to the negative voltage generation circuit 73 are controlled in the same manner as at the time T1 when the control signal D changes in level from Lo to Hi, so that the negative voltage generation circuit 73 restarts charging of a negative potential, thereby returning to a normal state.

As described above, also in the semiconductor integrated circuit of the present embodiment, latch up is allowed to cease only by controlling the negative potential VSS and not by, for example, cutting off a positive power supply voltage. Therefore, the present embodiment causes no adverse influence resulting from cutting off any circuit block other than a circuit block linked to a negative potential.

Furthermore, the potential of VSS is monitored, and a comparison of the VSS potential with the first reference potential VREF1 and with the second reference potential VREF2 is made, and thus the following operation is possible. That is, upon reliably ascertaining not only that latch up has occurred but also that the latch up has ceased, a recovery process from the latch up is halted so that the operation returns to a steady operation.

Moreover, in the present embodiment, using a charge pump that allows the charging capability of the negative voltage generation circuit 73 to vary, a switching control between high and low charging capabilities is performed based on the signal F that is the output of the control block 72. As described above, in the semiconductor integrated circuit of the present embodiment, the negative voltage generation circuit 73 is set to be in a low charging capability mode when activated, and thus even if the negative voltage VSS and, for example, the ground potential or the like are short-circuited, a phenomenon does not occur in which a large electric current flows to damage the negative voltage generation circuit 73. Further, in the case where after a lapse of a given length of time from the start of charging of a negative potential, the negative potential does not become a given voltage or higher even with an increased charging capability, the detection circuit that detects the occurrence of latch up functions to deactivate the negative voltage generation circuit 73 so as to halt the charging of the negative potential. Therefore, the semiconductor integrated circuit of the present embodiment makes it possible to prevent a large electric current from flowing continuously even if VSS and the ground potential are short-circuited and to detect the occurrence of latch up, and also is effective in protecting the negative voltage generation circuit that supplies a negative potential.

Although the description of the present embodiment uses the configuration in which one of input terminals of each of the comparators 76 and 77 is connected directly to the negative potential VSS, the semiconductor integrated circuit of the present invention is not limited thereto, and it also is possible to use a potential related to a negative potential, which changes with variation of the negative potential VSS, for the comparison with each of predetermined first and second reference potentials.

The semiconductor integrated circuit according to the present invention is useful as a semiconductor integrated circuit in which a n-channel MOS transistor is incorporated.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor integrated circuit, comprising:
a n-channel MOS transistor that is formed on a P-type region on a semiconductor substrate; and
a latch up detection circuit that detects an occurrence of latch up in the n-channel MOS transistor,
wherein the latch up detection circuit includes: a n-MOS transistor structure in which a source and a back gate are connected in common with the n-channel MOS transistor; and an electric current detection unit that detects an electric current flowing to a drain of the n-MOS transistor structure.

2. The semiconductor integrated circuit according to claim 1,
wherein the electric current detection unit is a resistor that has one end connected to the drain of the n-MOS transistor structure and the other end connected to a positive power supply voltage of the semiconductor integrated circuit.

3. The semiconductor integrated circuit according to claim 1,
wherein the electric current detection unit is an electric current detection circuit that is connected to the drain of the n-MOS transistor structure.

4. The semiconductor integrated circuit according to claim 1,
wherein the P-type region on the semiconductor substrate is a P-type substrate layer.

5. The semiconductor integrated circuit according to claim 1,
wherein the P-type region on the semiconductor substrate is a P-type diffusion layer that is formed in a N-type diffusion layer in a P-type substrate layer.

6. The semiconductor integrated circuit according to claim 1,
wherein a gate of the n-MOS transistor structure is connected to the source and the back gate of the n-MOS transistor structure.

7. The semiconductor integrated circuit according to claim 6,
wherein a negative voltage is applied to the gate, the source, and the back gate of the n-MOS transistor structure that are connected to one another.

8. The semiconductor integrated circuit according to claim 1,
wherein a drain of the n-channel MOS transistor is connected to an input terminal or an output terminal of the semiconductor integrated circuit.

9. A semiconductor integrated circuit, comprising:
a n-channel MOS transistor that is formed on a P-type region on a semiconductor substrate;
a latch up detection circuit that detects an occurrence of latch up in the n-channel MOS transistor;
a negative voltage generation circuit that supplies a negative potential to the n-channel MOS transistor; and
a control block that halts the supply of a negative potential from the negative voltage generation circuit when the occurrence of latch up is detected in the latch up detection circuit, and later restarts the supply of a negative potential.

10. The semiconductor integrated circuit according to claim 9,
wherein the latch up detection circuit has a n-MOS transistor structure in which a source and a back gate are connected in common with the n-channel MOS transistor.

11. The semiconductor integrated circuit according to claim 10,
wherein a negative potential supplied by the negative voltage generation circuit is applied to a source and a back gate of the n-channel MOS transistor and to the source and the back gate of the n-MOS transistor structure.

12. The semiconductor integrated circuit according to claim 9,
wherein the control block restarts the supply of a negative potential after a lapse of a predetermined length of time after halting the supply of a negative potential from the negative voltage generation circuit.

13. The semiconductor integrated circuit according to claim 9,
wherein the control block restarts the supply of a negative potential from the negative voltage generation circuit when the latch up detection circuit detects a recovery from the latch up.

14. The semiconductor integrated circuit according to claim 13,
wherein the latch up detection circuit has at least two comparators that are:
a first comparator that compares a potential related to a negative potential supplied from the negative voltage generation circuit with a first reference potential; and
a second comparator that compares the potential related to a negative potential supplied from the negative voltage generation circuit with a second reference potential that is lower than the first reference potential,
wherein based on outputs from the first comparator and the second comparator, the occurrence of latch up and the recovery from the latch up are detected.

15. The semiconductor integrated circuit according to claim 14,
wherein the control block has a delay circuit so as to suspend the supply of a negative potential from the negative voltage generation circuit during a given time period after the latch up detection circuit has detected the recovery from the latch up.

16. The semiconductor integrated circuit according to claim 9,
wherein the negative voltage generation circuit is capable of switching among halting of charging of the negative potential, charging of the negative potential at a low charging capability, and charging of the negative potential at a high charging capability,
the latch up detection circuit has at least two comparators that are a first comparator that compares a potential related to a negative potential supplied from the negative voltage generation circuit with a first reference potential and a second comparator that compares the potential related to a negative potential supplied from the negative voltage generation circuit with a second reference potential that is lower than the first reference potential,
the control block has a delay circuit that delays a signal in the control block and a timer circuit that fixes an output signal from the control block to the negative voltage generation circuit for a given length of time, and
when the control block detects that the negative potential is equal to the second reference potential based on outputs from the first comparator and the second comparator, the control block halts charging of the negative potential by the negative voltage generation circuit, and later, when the control block detects that the negative potential has become equal to the first reference potential based on outputs from the first comparator and the second comparator, the control block has the negative voltage generation circuit perform charging of the negative potential at a low charging capability during a period of time in which the timer circuit fixes the output signal after a delay time period delayed in the delay circuit, and after completion of the given length of time in which the timer circuit fixes the output signal, the control block has the negative voltage generation circuit perform charging of the negative potential at a high charging capability.

* * * * *